United States Patent
Shea et al.

(10) Patent No.: US 9,299,774 B2
(45) Date of Patent: Mar. 29, 2016

(54) DEVICE STRUCTURE AND METHODS OF FORMING SUPERJUNCTION LATERAL POWER MOSFET WITH SURROUNDING LDD

(71) Applicant: Great Wall Semiconductor Corporation, Tempe, AZ (US)

(72) Inventors: Patrick M. Shea, Oviedo, FL (US); Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 0 days.

(21) Appl. No.: 14/333,323

(22) Filed: Jul. 16, 2014

(65) Prior Publication Data

US 2015/0021686 A1    Jan. 22, 2015

Related U.S. Application Data

(60) Provisional application No. 61/856,631, filed on Jul. 19, 2013, provisional application No. 61/857,193, filed on Jul. 22, 2013.

(51) Int. Cl.

| *H01L 21/336* | (2006.01) |
|---|---|
| *H01L 29/06* | (2006.01) |
| *H01L 29/66* | (2006.01) |
| *H01L 29/78* | (2006.01) |
| *H01L 29/40* | (2006.01) |

(52) U.S. Cl.
CPC .......... *H01L 29/0634* (2013.01); *H01L 29/404* (2013.01); *H01L 29/66659* (2013.01); *H01L 29/66681* (2013.01); *H01L 29/7823* (2013.01); *H01L 29/7835* (2013.01)

(58) Field of Classification Search
CPC ..................... H01L 29/0634; H01L 29/66659; H01L 29/7835; H01L 29/7823; H01L 29/404; H01L 29/66681
USPC .......................................... 438/273, 274, 286
See application file for complete search history.

(56) References Cited

U.S. PATENT DOCUMENTS

| 6,207,994 B1 * | 3/2001 | Rumennik et al. ............ 257/342 |
| 7,023,050 B2 | 4/2006 | Salama et al. |
| 2012/0273878 A1 * | 11/2012 | Mallikarjunaswamy ..... 257/335 |
| 2013/0082326 A1 * | 4/2013 | Tang ............................. 257/335 |

* cited by examiner

*Primary Examiner* — Hung Vu

(74) *Attorney, Agent, or Firm* — Robert D. Atkins; Patent Law Group: Atkins and Associates, P.C.

(57) ABSTRACT

A semiconductor device has a substrate and a gate formed over the substrate. An LDD region is formed in the substrate adjacent to the gate. A superjunction is formed in the LDD region while a portion of the LDD region remains between the superjunction and gate. A mask is formed over the substrate. A first region is doped with a first type of dopant using the mask. A stripe is doped with a second type of dopant using a portion of the mask. A drain contact region is formed in the substrate. The first region extends to the drain contact region. The first region and stripe are formed using chain implants. A source field plate and drain field plate are formed over the substrate. A trench is formed in the substrate. A source contact region is formed in the trench.

25 Claims, 30 Drawing Sheets

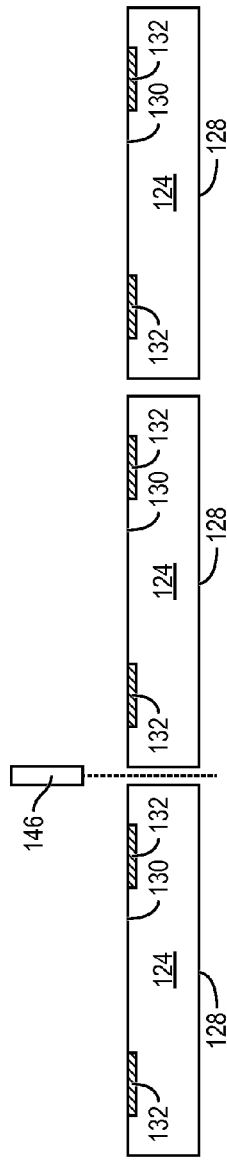
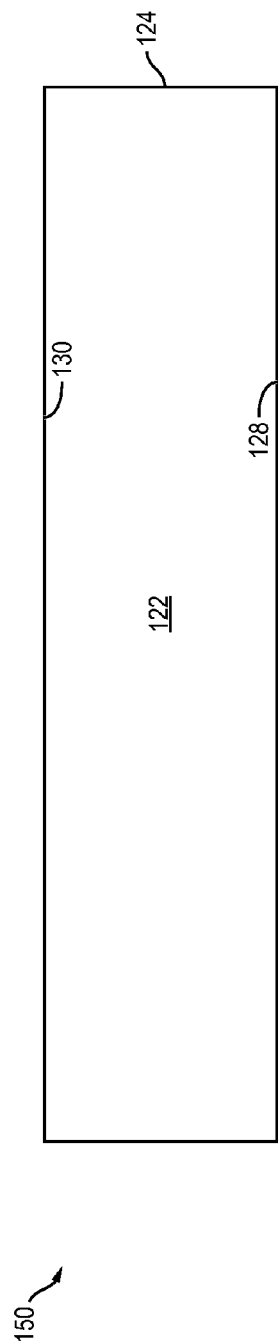
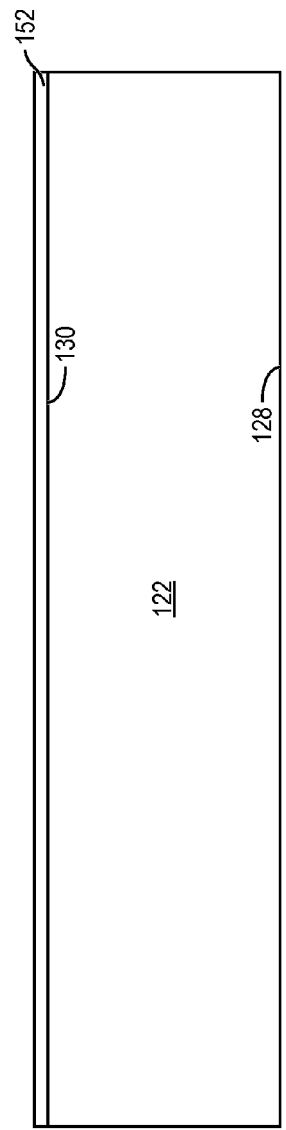

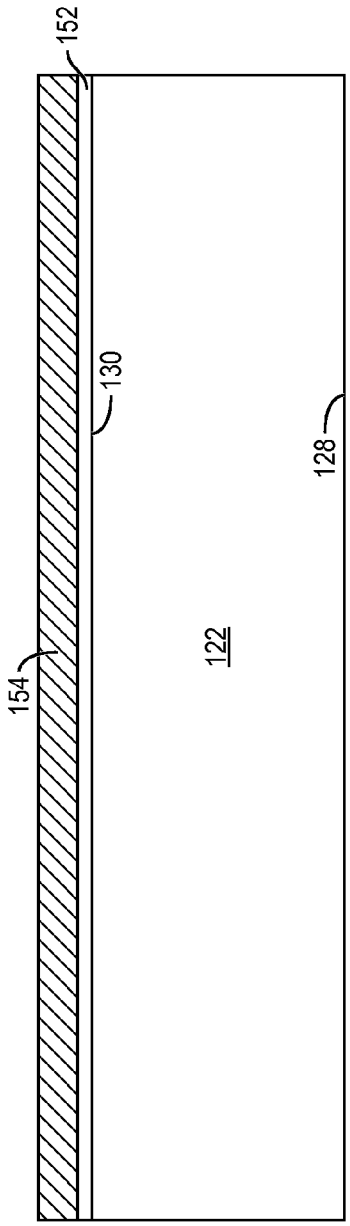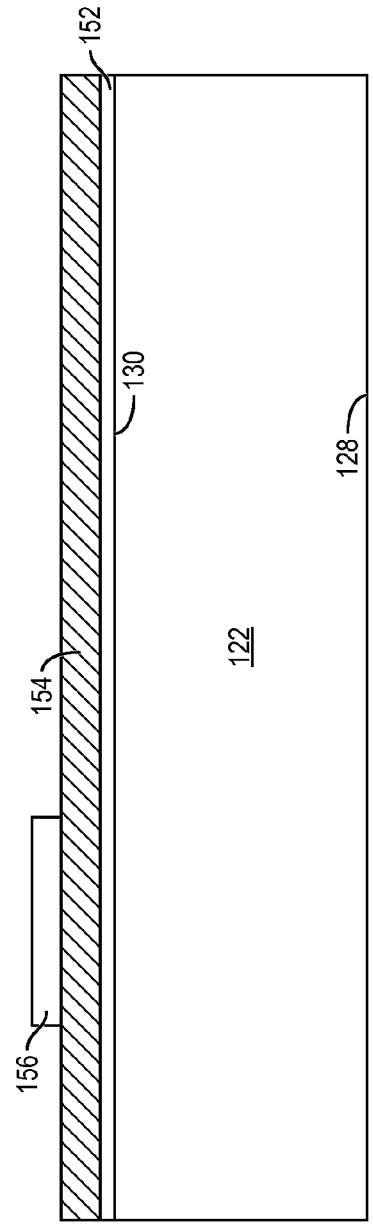

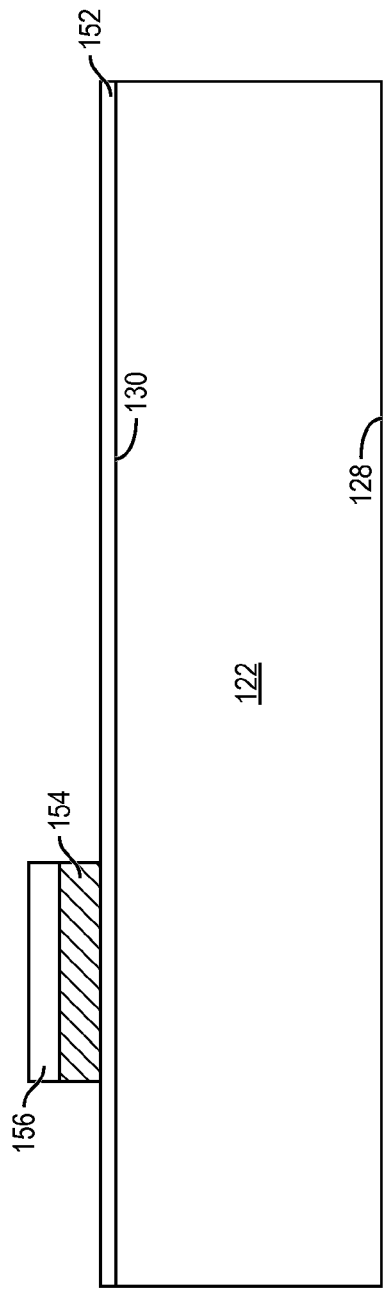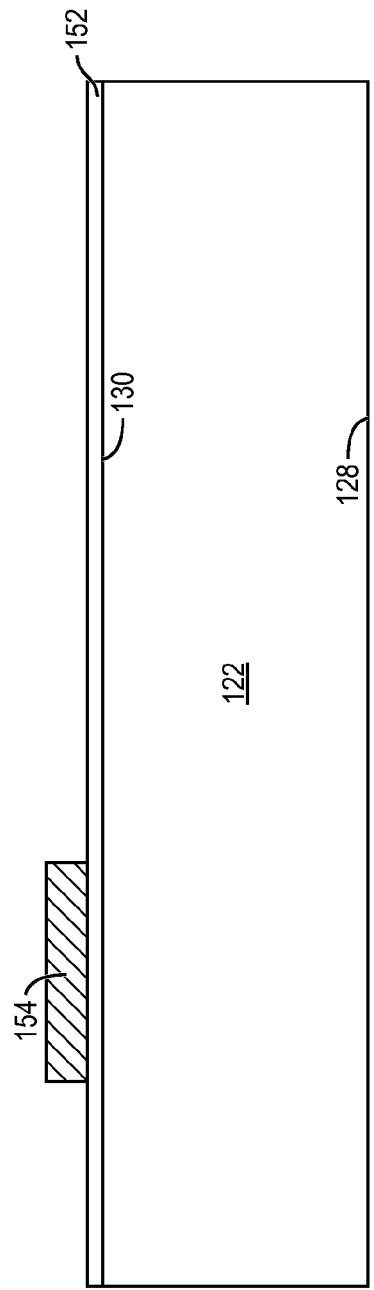

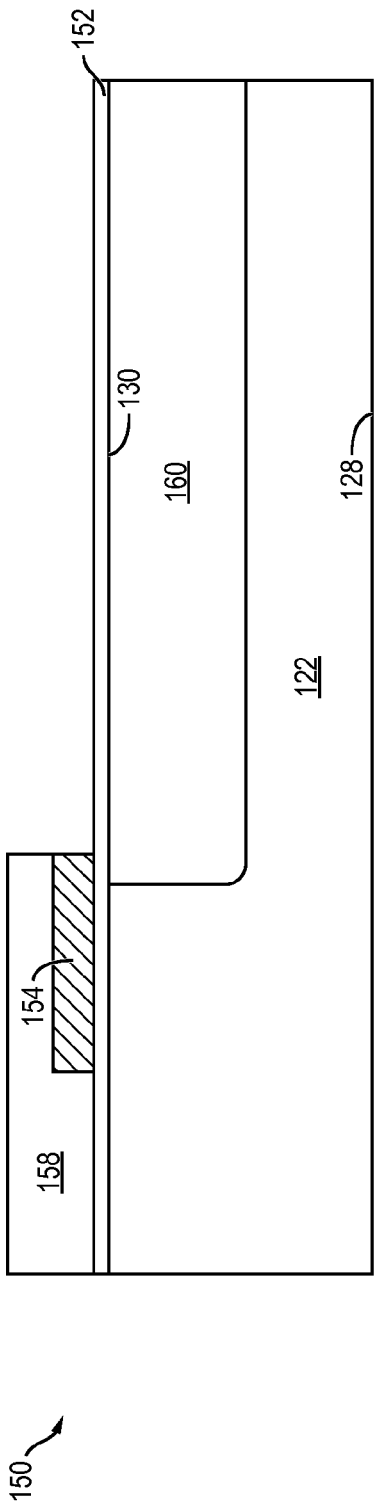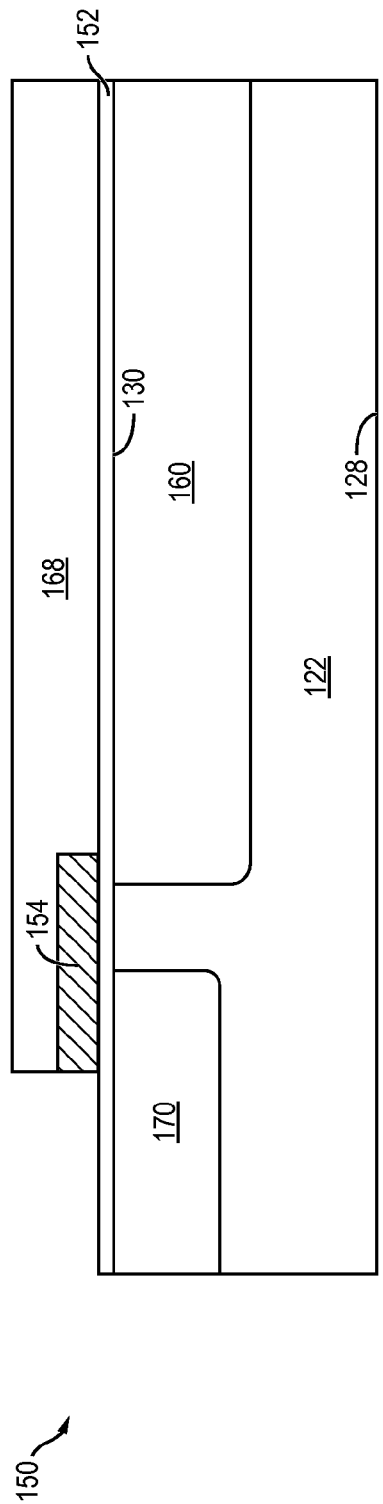

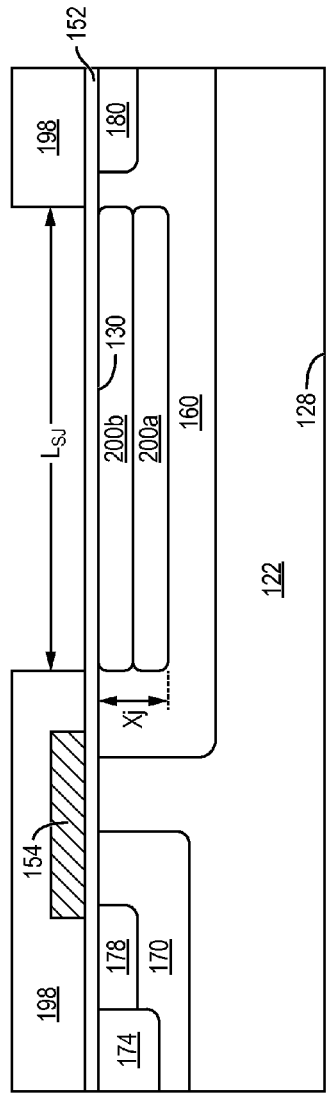
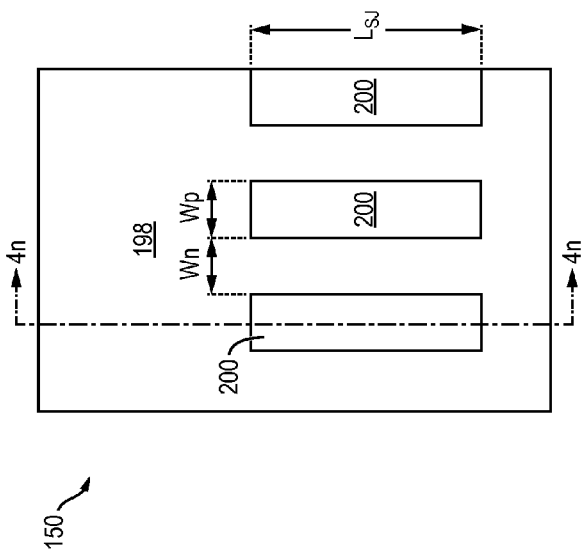
FIG. 4n
FIG. 4o

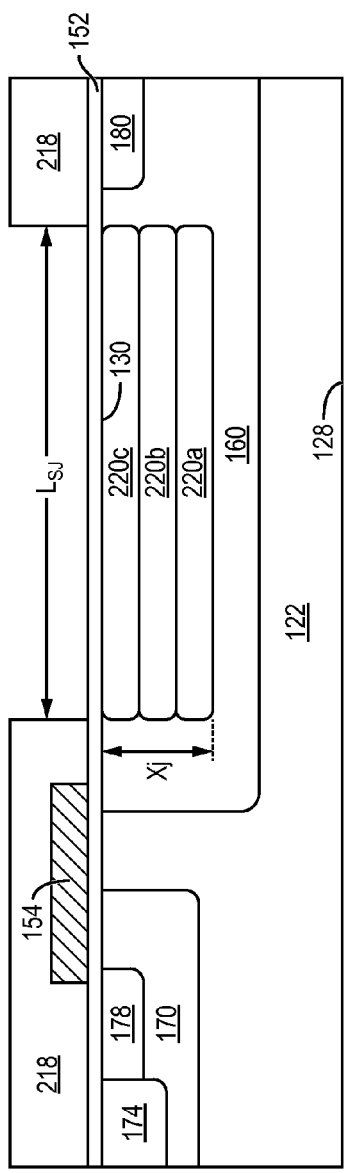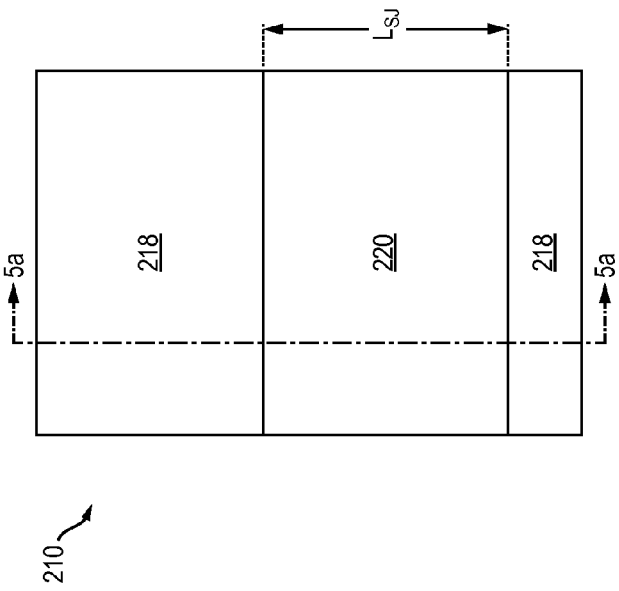
FIG. 5a
FIG. 5b

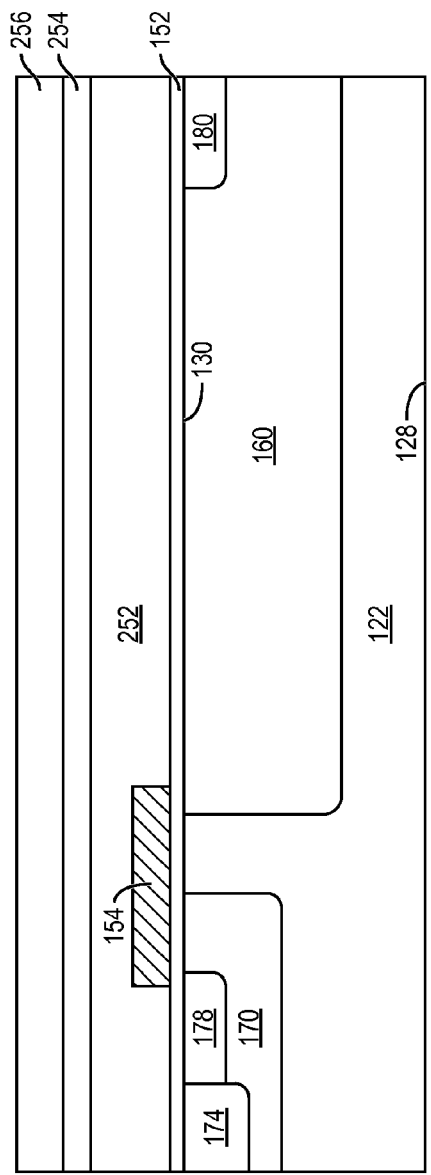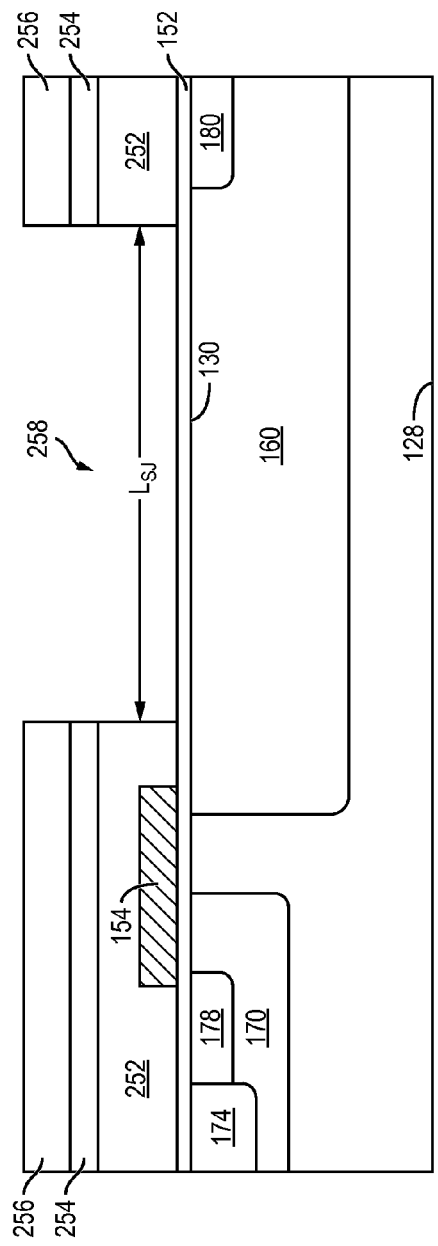

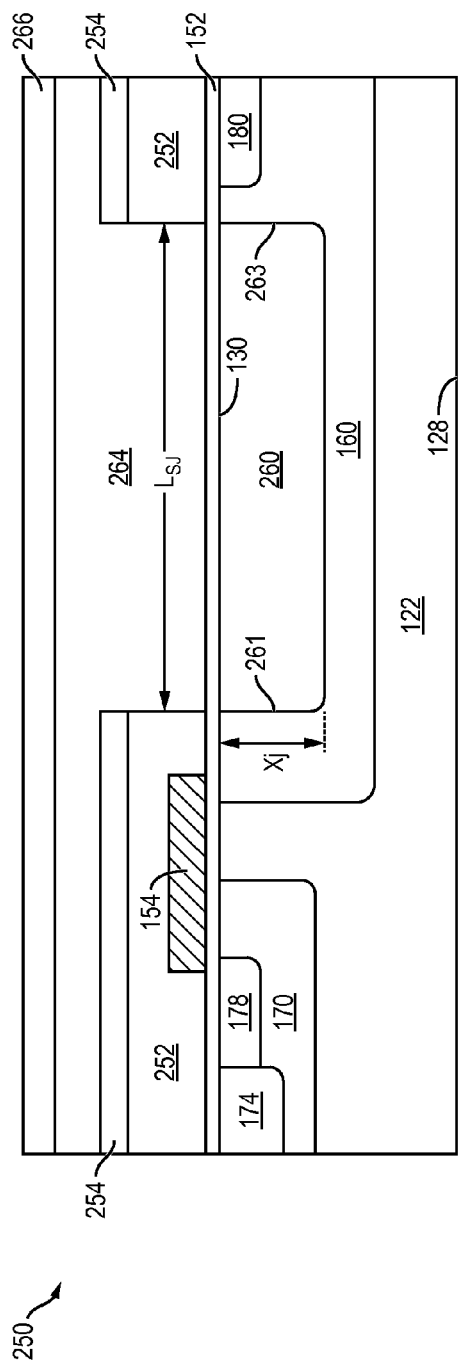
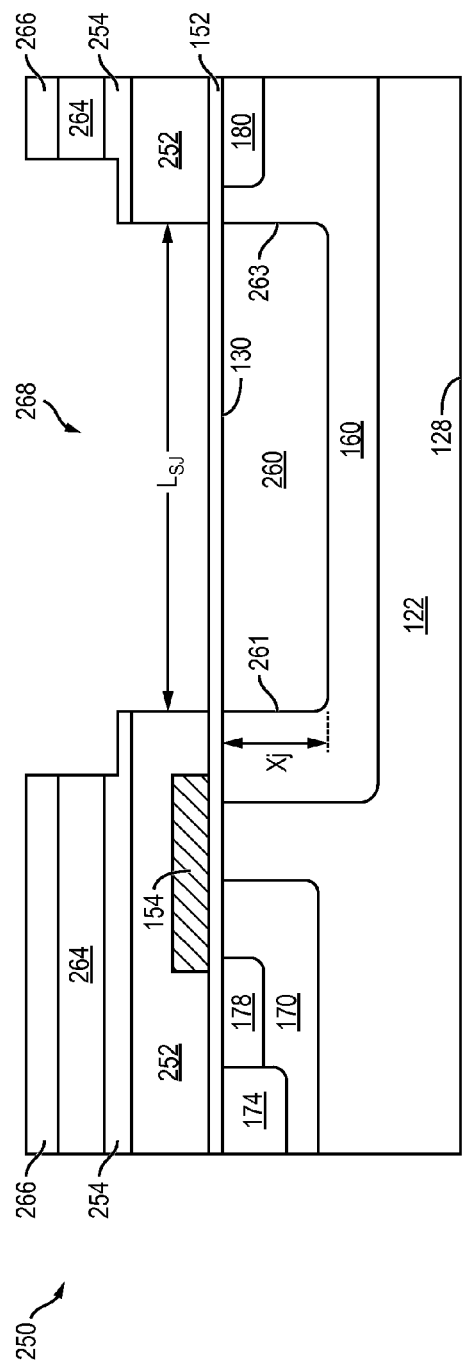
FIG. 6e
FIG. 6f

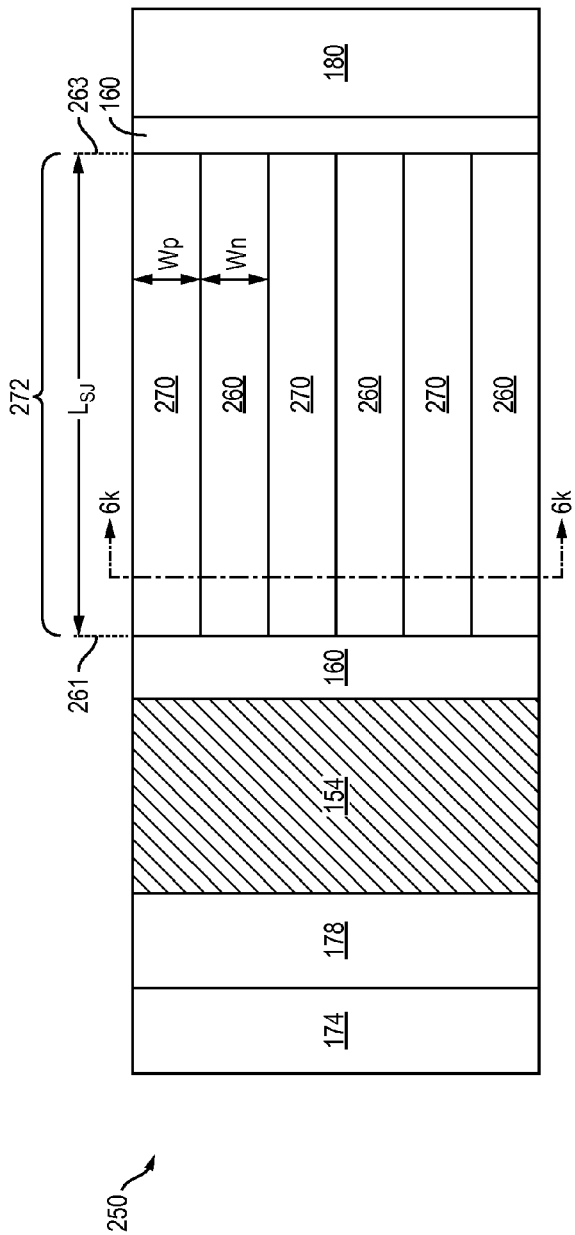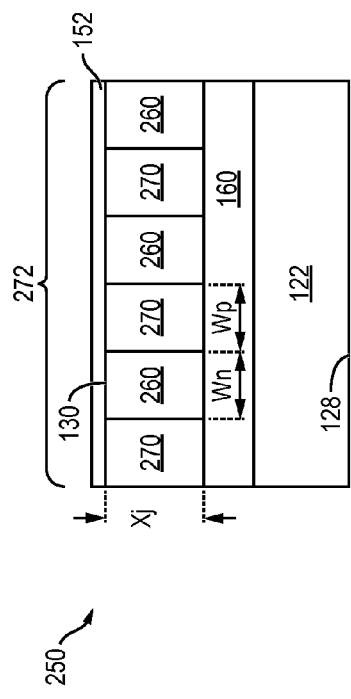
FIG. 6j
FIG. 6k

DEVICE STRUCTURE AND METHODS OF FORMING SUPERJUNCTION LATERAL POWER MOSFET WITH SURROUNDING LDD

CLAIM OF DOMESTIC PRIORITY

The present application claims the benefit of U.S. Provisional Application No. 61/856,631, filed Jul. 19, 2013 and U.S. Provisional Application No. 61/857,193, filed Jul. 22, 2013, which applications are incorporated herein by reference.

FIELD OF THE INVENTION

The present invention relates generally to electronic circuits and semiconductor devices and, more specifically, to a semiconductor device and method of forming a power semiconductor device including a superjunction with surrounding lightly doped drain (LDD) region.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. In particular, power MOSFETs are commonly used in electronic circuits, such as communication systems and power supplies, as electric switches to enable and disable the conduction of relatively large currents in DC to DC converter applications.

A power MOSFET device includes a large number of MOSFET cells or individual transistors that are connected in parallel and distributed across a surface of a semiconductor die. Power MOSFET devices are typically used as electronic switches to control power flow to a circuit. A control signal at a gate terminal of the power MOSFET controls whether current flows through the MOSFET between a drain terminal and source terminal of the MOSFET. The conduction path between the drain terminal and source terminal of a MOSFET is wired in series with a circuit to be switched, so that when the MOSFET is off, i.e., the MOSFET limits current between the source and drain terminals, current is also limited through the switched circuit. When the MOSFET is on, current flows through the MOSFET and the switched circuit to power the switched circuit.

Power MOSFETs waste energy through switching power loss and conduction power loss. Conduction losses are proportional to the effective resistance of the conduction path from the drain terminal to the source terminal when the transistor is turned on (RDSON), i.e., the resistance exhibited for current flowing to powered circuits. A MOSFET with a higher RDSON will absorb more energy, and generate more heat, as current flows through the MOSFET to the circuit being powered.

Switching losses are proportional to the switching frequency and internal parasitic capacitance, most significantly gate to drain capacitance (Cgd). A higher Cgd indicates more energy is used in order to switch a MOSFET from on to off, or from off to on. The gate charge of a MOSFET (Qg) indicates the amount of charge supplied to the gate terminal to switch a MOSFET on. Qg is proportional to the Cgd of a MOSFET. Frequency of switching increases switching loss because the power loss experienced during a single switch cycle is experienced more often.

One goal of power MOSFET manufacturers is to produce power MOSFET devices with lower conduction losses. Lower conduction loss, i.e., lower RDSON, reduces the amount of energy absorbed by the power MOSFET when the MOSFET is conducting. When a power MOSFET absorbs energy, more energy is required to power the circuit as a whole. In addition, the absorbed energy is released by the MOSFET as thermal energy which may need to be dissipated away from the MOSFET using a heatsink, or other method, to prevent damage to the MOSFET.

Another goal of power MOSFET manufacturers is to produce power MOSFET devices which can switch higher voltage power signals. In order to switch a power signal of a certain voltage level, a power MOSFET sustains an equivalent voltage between the drain terminal and source terminal when off. The maximum voltage level which a power MOSFET can be used with is determined by the BVdss value of the MOSFET, or the maximum blocking voltage of the MOSFET between drain and source.

Conventional power MOSFETs use a vertical or trench configuration due to a characteristically low RDSON. However, trench power MOSFETS commonly exhibit high Cgd and Qg, which results in a higher switching power loss. The trench MOSFET structure can be modified to improve Cgd, but at the expense of significantly increased manufacturing complexity. On the other hand, lateral double-diffused MOSFETs (LDMOS) offer inherently lower Qg than vertical double-diffused power MOSFETS (VDMOS), which reduces switching power loss, but have a higher RDSON, which increases conduction power loss.

Conventional power MOSFETs include a lightly doped drain (LDD), or drift, region to support a higher BVdss. FIG. 1a illustrates a conventional N-channel LDMOS power MOSFET cell 10. MOSFET cell 10 is formed from P-doped base substrate material 12, and includes P-channel area 14, P+ source contact region 16, N+ source contact region 18, and N+ drain contact region 20. Gate dielectric 22 is formed over base substrate material 12, and polysilicon (poly) gate 24 is formed over the gate dielectric. LDD region 26 is lightly doped with an N-type dopant and runs from an area under poly gate 24 to N+ drain contact region 20.

The doping concentration of LDD region 26 has an inverse relationship to BVdss, but also has an inverse relationship to RDSON. Lowering the doping concentration of LDD region 26 results in MOSFET cell 10 having a higher BVdss, but also a higher RDSON. The LDD region supports a high BVdss of MOSFET cell 10 by providing additional area between a voltage applied to the MOSFET at N+ drain contact region 20 and the channel under poly gate 24. The additional area, combined with a lower doping concentration, provided by LDD region 26 spreads out a depletion region between the applied voltage at N+ drain contact region 20 and the channel under poly gate 24 to produce a lower magnitude electric field for a given voltage, thereby increasing BVdss. While LDD region 26 results in a reduced electric field, fixed potential points exist at the edge of poly gate 24 and at N+ drain contact region 20 which cause the electric field to peak at each end of the LDD region.

A depletion region exists at the boundary between LDD region 26 and base substrate material 12. As a voltage applied to N+ drain contact region 20 rises, the depletion region between LDD region 26 and base substrate material 12 grows. The doping of LDD region 26 is such that LDD region 26 will be fully depleted of charge carriers prior to MOSFET cell 10 breaking down. Base substrate material 12 is more lightly doped than LDD region 26, and the depletion region extends further into the base substrate material than the size of the LDD region.

Power MOSFET manufacturers want to create devices with lower RDSON, and have developed superjunction structures used as the drift region of a MOSFET cell, instead of an LDD region, to reduce RDSON. FIG. 1b illustrates MOSFET cell 30 which utilizes a superjunction drift region. MOSFET cell 30 is formed in a similar process to MOSFET cell 10 in FIG. 1a, but N-doped stripes 32 and P-doped stripes 34 are formed to replace LDD region 26. N-doped stripes 32 include a width Wn. P-doped stripes 34 include a width Wp. Stripes 32 and 34 include a junction depth into base substrate material 12, Xj, which is the same for each stripe. Stripes 32 and 34 are doped as heavily as possible while still fully depleting prior to the breakdown of MOSFET cell 30. A superjunction is used to provide as much heavily doped area between N+ drain contact region 20 and poly gate 24 as possible.

Superjunctions remove the relationship between BVdss and doping concentration, as is the case with MOSFET cell 10 which uses LDD region 26. A higher doping concentration is used in the superjunction as compared to LDD region 26, resulting in lower RDSON. MOSFETs designed with a superjunction improve the RDSON of the MOSFET without a significant increase in Qg, resulting in a net reduction of total power loss.

Superjunctions maintain a high BVdss despite a high doping concentration by replacing the depletion region between LDD region 26 and base substrate material 12 with a plurality of depletion regions between each adjacent N-doped stripe 32 and P-doped stripe 34. Stripes 32 and 34 deplete each other instead of base substrate material 12, therefore the electric field of the superjunction is oriented laterally. The doping concentrations of stripes 32 and 34 are calibrated such that the stripes fully deplete prior to breakdown of MOSFET cell 30, similarly to LDD region 26 in MOSFET cell 10. After stripes 32 and 34 are fully depleted, the voltage at drain contact region 20 is supported by the length, Lsj, of the superjunction. When the superjunction is fully depleted, the electric field from applied voltage at N+ drain contact 20 to poly gate 24 is oriented lengthwise through the superjunction. Making stripes 32 and 34 longer increases BVdss by stretching the electric fields over a longer distance, reducing the magnitude of the electric fields.

N-doped stripes 32 and P-doped stripes 34 include strong electric fields at the depletion regions between the stripes. In addition, as with LDD region 26, inherently stronger electric fields exist under the edge of poly gate 24 and at N+ drain contact region 20. The strong electric fields of the depletion regions between N-doped stripes 32 and P-doped stripes 34 combine with the electric field peaks at the edge of poly gate 24 and N+ drain contact region 20 to create an electric field strong enough to cause breakdown of MOSFET cell 30 at a lower voltage than is desired.

The strong electric fields of the superjunction depletion regions combining with the electric field peaks at poly gate 24 and N+ drain contact region 20 also creates hot carriers. Hot carriers are electrons or holes which reach an energy high enough to be injected into dielectric layer 22. Hot carriers trapped in dielectric layer 22 increase leakage current through the dielectric layer, and eventually lead to a short circuit between poly gate 24 and base substrate material 12. Hot carriers trapped in dielectric layer 22 also create an electric field in base substrate material 12 and disrupt the charge balance of the superjunction. BVdss is reduced by hot carriers affecting the charge balance of the superjunction.

Thinner stripes 32 and 34 are doped at a higher concentration while still fully depleting at the same voltage as thicker superjunction stripes. In addition, using thinner stripes 32 and 34 does not reduce the total conduction area through N-doped stripes 32 when MOSFET cell 30 is on because the area through the N-doped stripes is approximately half of the total width of the MOSFET regardless of the width of each individual stripe. Therefore, thinner stripes 32 and 34 benefit total RDSON without hurting BVdss.

Forming deeper stripes 32 and 34 reduces RDSON by providing more conduction area for current through MOSFET cell 30 when the MOSFET is on. However, fabricating a deep superjunction LDMOS requires high energy ion implants, a trench etch with sidewall implant, or a multi-step silicon epitaxy. Each option for fabricating a deep superjunction presents challenges in terms of cost, process engineering, and process equipment capability. Fabricating a deep junction with narrow stripe widths using conventional implant and well techniques is challenging because the thermal diffusion processes required to form deep wells cause the N and P stripes to diffuse together, which reduces or eliminates the benefits of a superjunction. Using a high resolution photoresist is challenging because as resolution of the photoresist is increased, thickness is decreased. The thin photoresist required for high resolution ion implants does not easily block the high energy ion implants required to form deep junctions.

FIG. 1c illustrates the theoretical relationship between stripe width, junction depth, and RDSON. FIG. 1c shows that RDSON is reduced as stripe width (Wn and Wp) is reduced, and as junction depth (Xj) is increased.

SUMMARY OF THE INVENTION

A need exists for a power MOSFET structure with improved device performance, e.g., low Cgd, low RDSON, high BVdss, and efficient manufacturability. Accordingly, in one embodiment, the present invention is a method of making a semiconductor device comprising the steps of providing a substrate, forming a gate over the substrate, forming an LDD region in the substrate adjacent to the gate, and forming a superjunction in the LDD region while a portion of the LDD region remains between the superjunction and the gate.

In another embodiment, the present invention is a method of making a semiconductor device comprising the steps of providing a substrate, forming a gate over the substrate, forming an LDD region in the substrate adjacent to the gate, and forming a superjunction in the LDD region.

In another embodiment, the present invention is a method of making a semiconductor device comprising the steps of providing a substrate, forming an LDD region in the substrate, and forming a superjunction in the LDD region.

In another embodiment, the present invention is a semiconductor device comprising a substrate. An LDD region is formed in the substrate. A superjunction is formed in the LDD region.

BRIEF DESCRIPTION OF THE DRAWINGS

FIGS. 3a-3d illustrate a semiconductor wafer with a plurality of semiconductor die separated by a saw street;

FIGS. 5a-5h illustrate a hard mask method of forming a power MOSFET utilizing a superjunction with surrounding LDD region;

FIGS. 6a-6k illustrate a hard mask method of forming a power MOSFET utilizing a self-aligned superjunction with surrounding LDD region;

DETAILED DESCRIPTION OF THE DRAWINGS

Figure 1A:
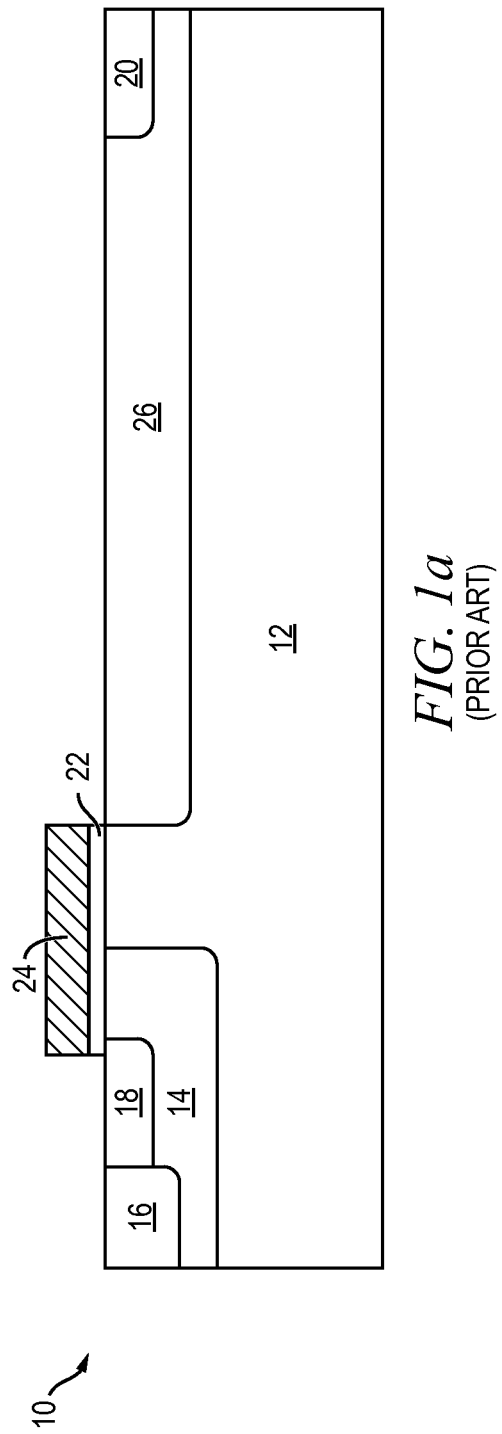
FIGS. 1a-1c illustrate conventional power MOSFETs.
Figure 1B:
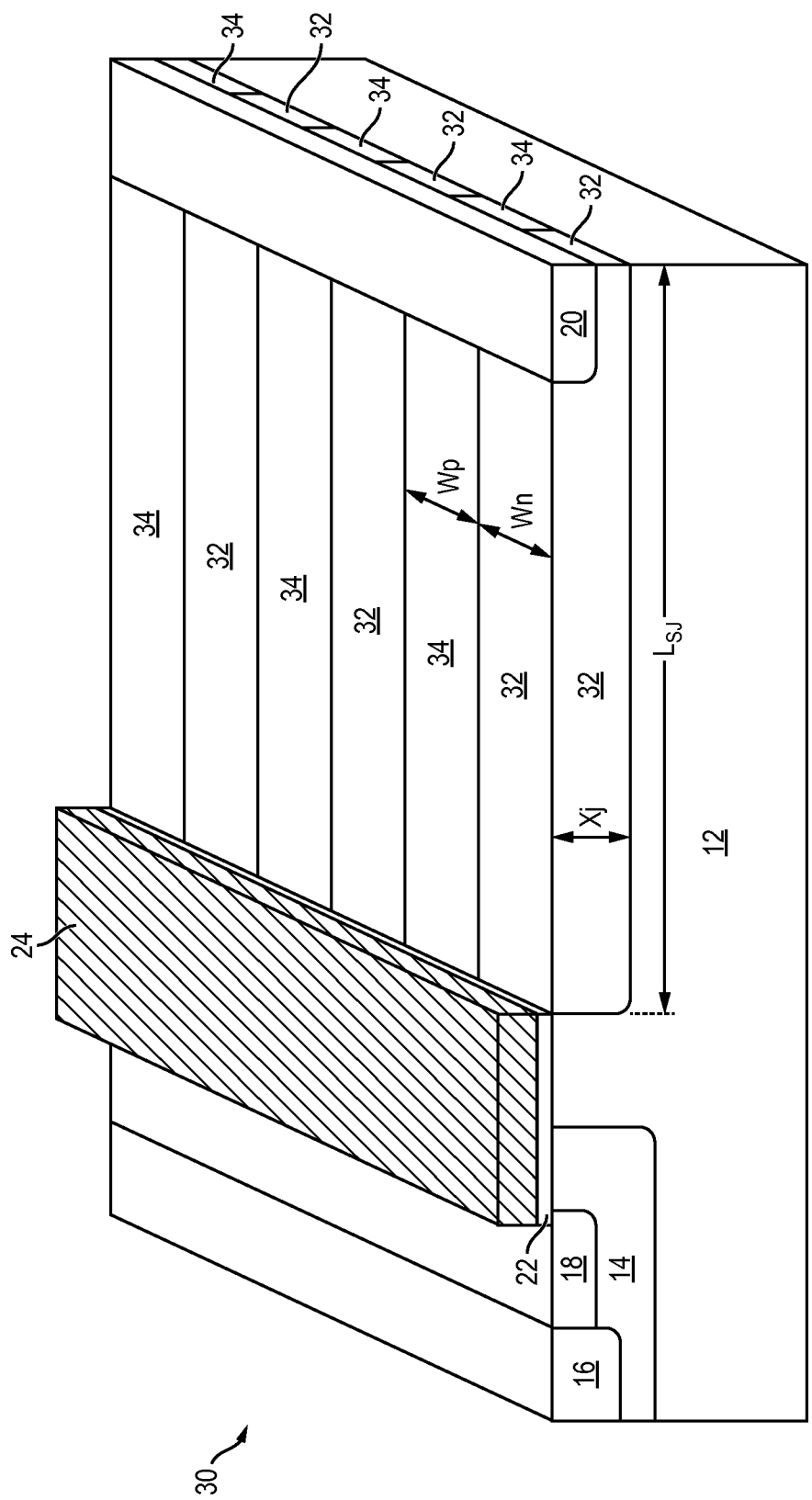
Figure 1C:
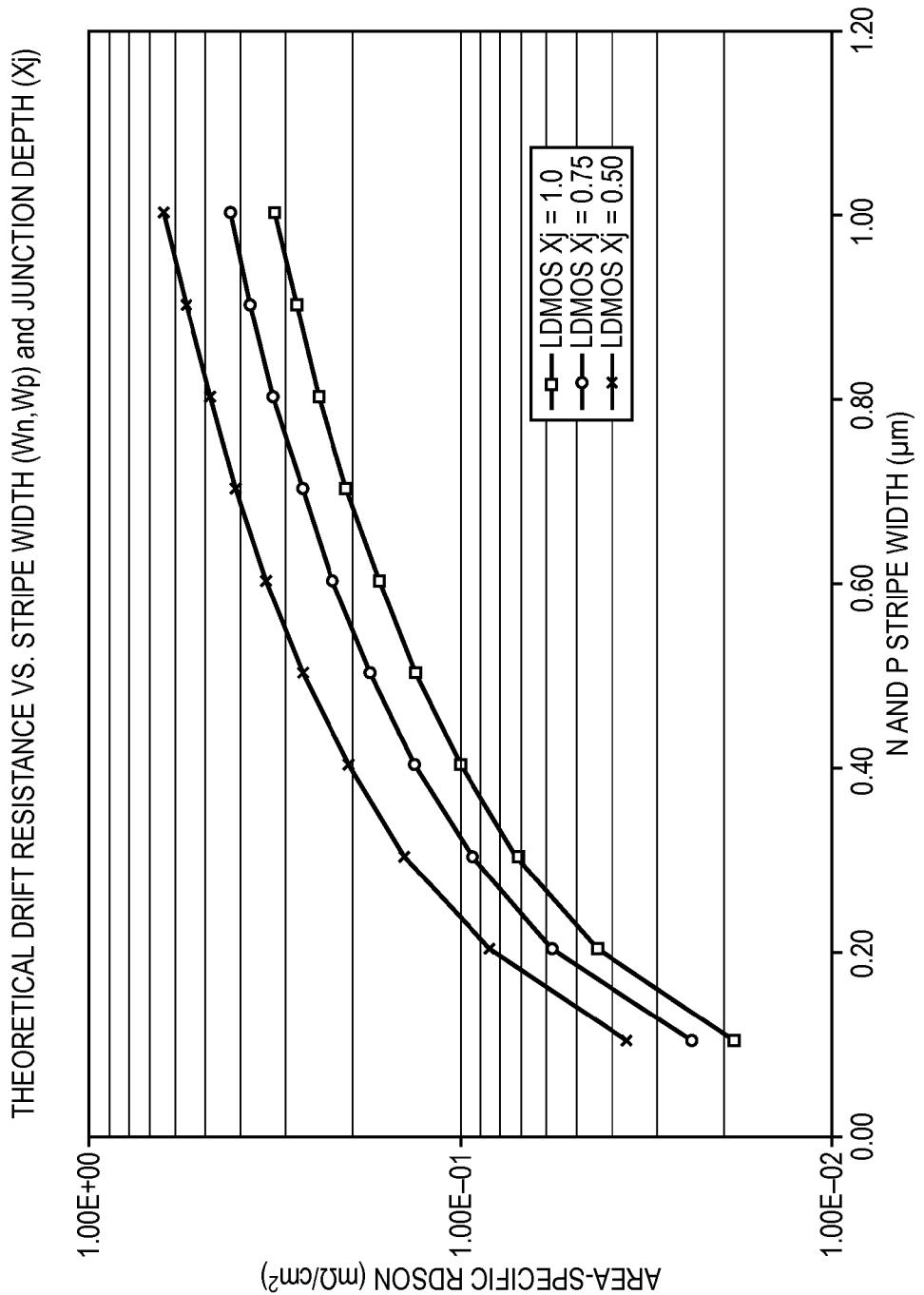

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

A region of a semiconductor wafer can be negatively doped or positively doped. Negatively doped, or N-doped, regions are doped with a negative, or N-type, dopant, such as phosphorus, antimony, or arsenic. Each molecule of an N-type dopant contributes an additional negative carrier, i.e., an electron, to the semiconductor wafer. Positively doped, or P-doped, regions are doped with a positive, or P-type, dopant such as boron, aluminum, or gallium. Each molecule of P-type dopant contributes an additional positive carrier, i.e. a hole, to the semiconductor wafer. A region of one doping type can be made into a region of the other doping type by adding dopant of the second type in excess of the existing doping concentration. N-type and P-type regions are oppositely doped.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
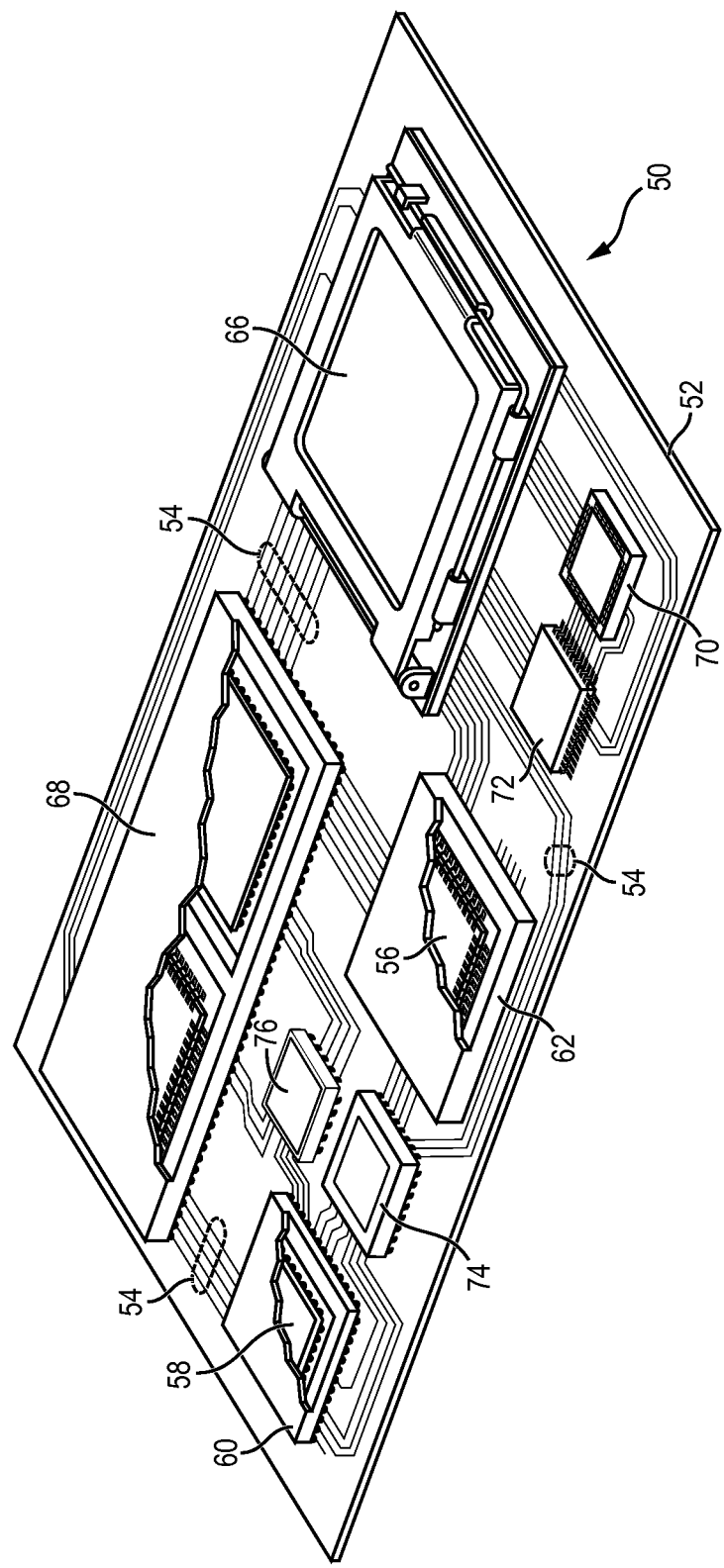
FIG. 2 illustrates a printed circuit board (PCB) with different types of packages mounted to a surface of the PCB.

FIG. 2 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
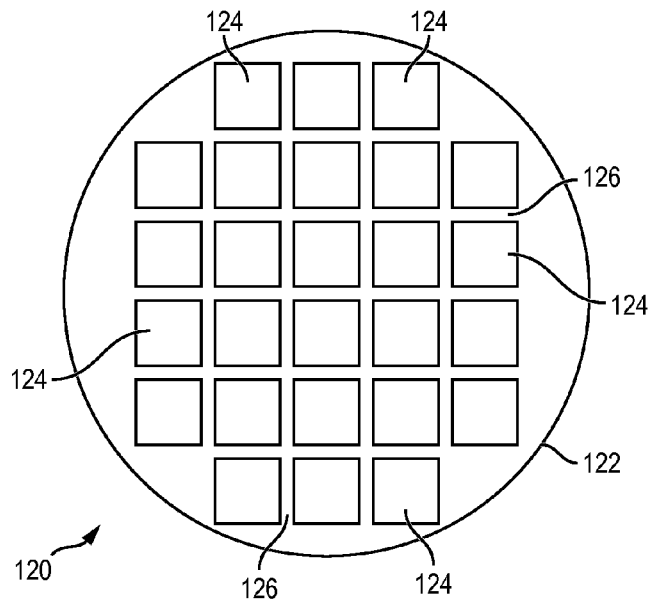

FIG. 3a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
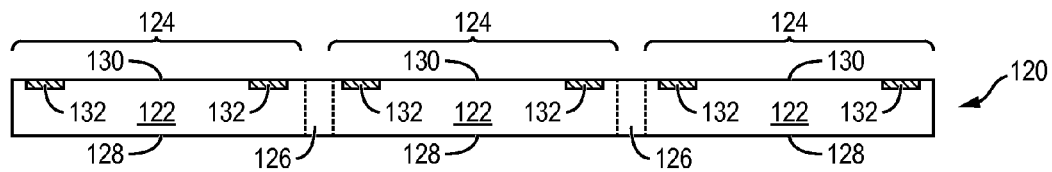

FIG. 3b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), titanium (Ti) or other suitable electrically conductive material. In one embodiment, Ti is formed over Al by sputtering for later Cu plating. Other metal layers compatible with Cu plating can also be used to form conductive layer 132. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 3C:
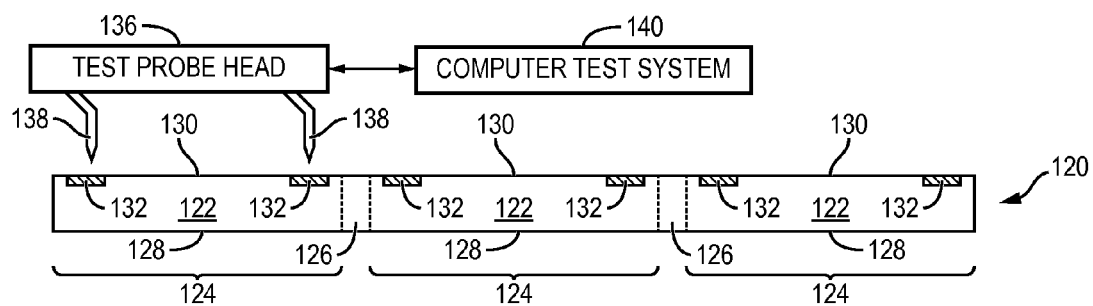

The active and passive components within semiconductor die 124 undergo testing at the wafer level for electrical performance and circuit function. Each semiconductor die 124 is tested for functionality and electrical parameters, as shown in FIG. 3c, using a test probe head 136 including a plurality of probes or test leads 138, or other testing device. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 3d, semiconductor wafer 120 is singulated through saw street 126 using a saw blade or laser cutting tool 146 into individual semiconductor die 124. The individual semiconductor die 124 can be inspected and electrically tested for identification of KGD post singulation.

Figure 4G:
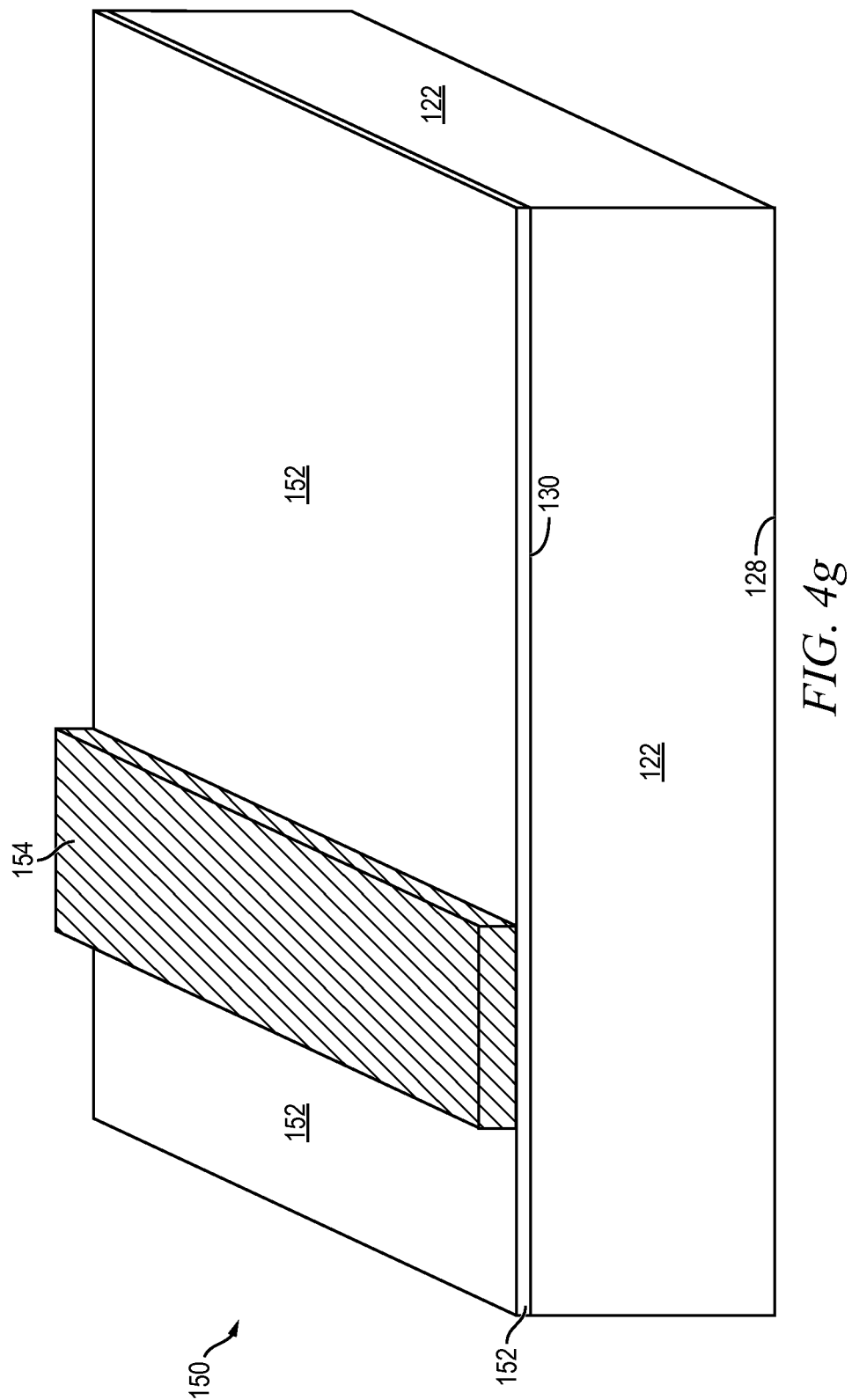
FIGS. 4a-4p illustrate a soft mask method of forming a power MOSFET utilizing a superjunction with surrounding LDD region.
Figure 4J:
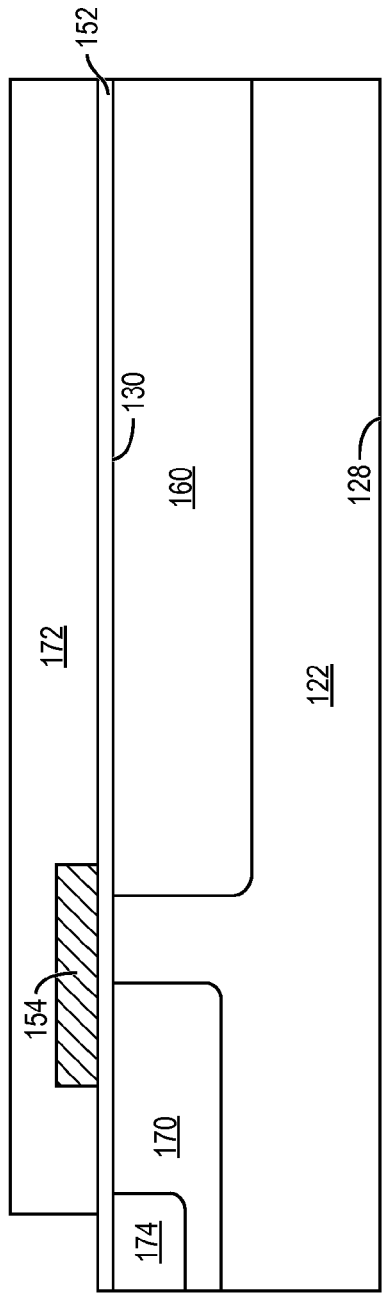
Figure 4K:
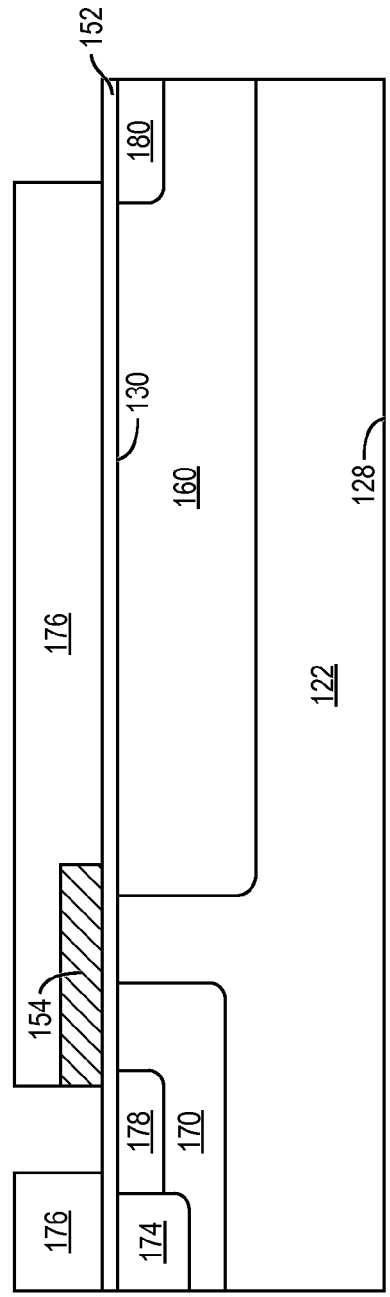
Figure 4L:
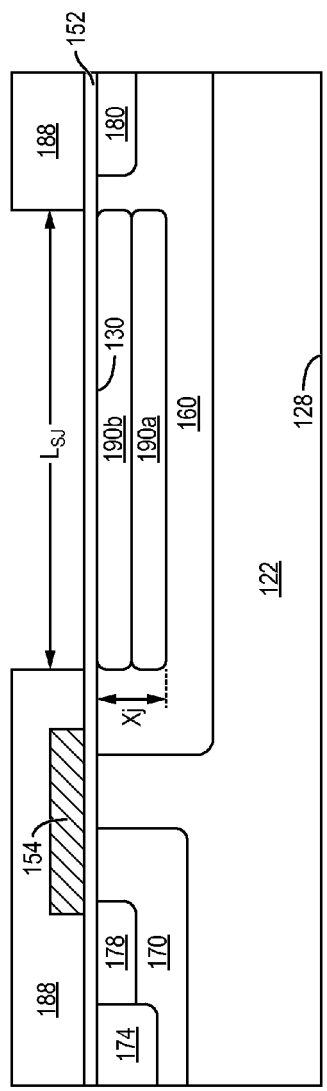
Figure 4M:
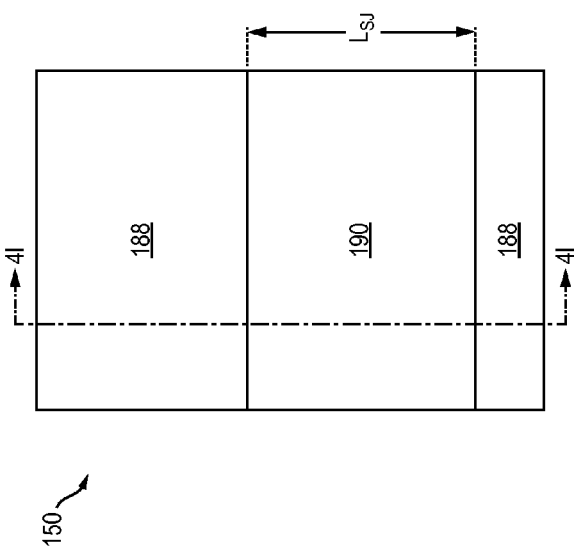
Figure 4P:
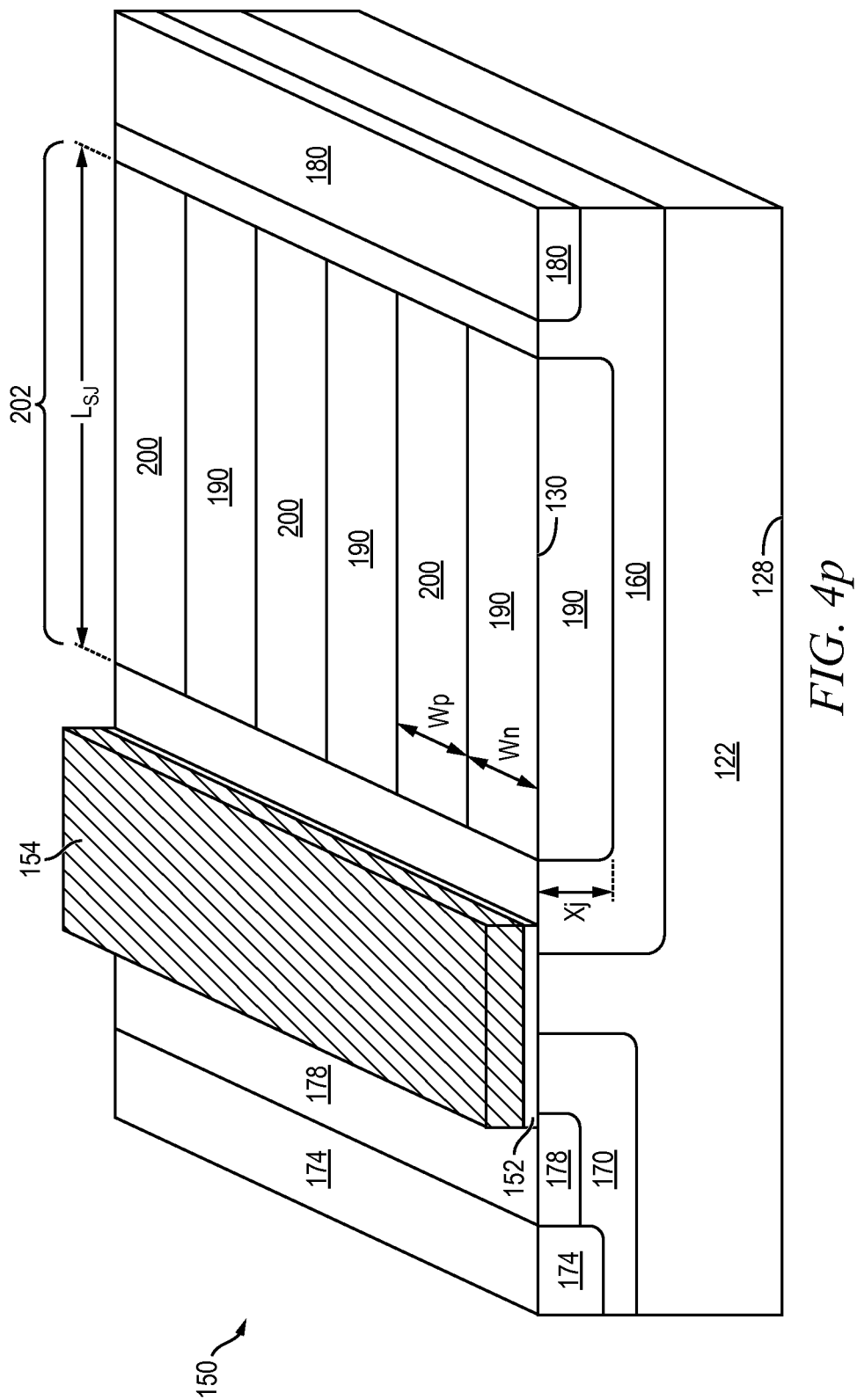

FIGS. 4a-4p illustrate, in relation to FIGS. 2 and 3a-3d, a soft mask method of forming a power MOSFET with a superjunction and surrounding LDD region on an active surface of semiconductor die 124. FIG. 4a shows a cross-sectional view of a portion of semiconductor die 124 used in formation of MOSFET cell 150. Typically, a plurality of MOSFET cells 150 is formed on active surface 130, and connected in parallel, to create a power MOSFET device on semiconductor die 124. MOSFET cell 150 is used in semiconductor designs other than a discrete power MOSFET in other embodiments.

MOSFET cell 150 can be an n-channel device (N-MOS) or a p-channel device (P-MOS), where "p" denotes a positive carrier type (holes) and "n" denotes a negative carrier type (electrons). Although the present embodiment of MOSFET cell 150 is described in terms of an N-MOS device formed on semiconductor die 124 including P-doped base substrate material 122, the opposite type semiconductor material can be used to form a P-MOS device.

In FIG. 4b, insulation or dielectric layer 152 is formed over active surface 130 as a gate dielectric. Dielectric layer 152 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), polyimide (PI), benzocyclobutene (BCB), polybenzoxazoles (PBO), or other suitable dielectric material. Dielectric layer 152 is formed using PVD, CVD, screen printing, spin coating, spray coating, sintering, or thermal oxidation. In one embodiment, a thin film of SiO2 is grown on active surface 130 by thermal oxidation.

In FIG. 4c, a polysilicon layer 154 is formed over dielectric layer 152. Polysilicon layer 154 is used as the gate material in the final structure of MOSFET cell 150. In other embodiments, metal is used to form the gate of MOSFET cell 150. In some embodiments, polysilicon layer 154 is doped with an N-type or P-type dopant. In FIG. 4d, photoresist layer 156 is formed over polysilicon layer 154. A portion of photoresist layer 156 is removed by an etching or photolithography process to expose a portion of polysilicon layer 154. A remaining portion of photoresist layer 156 not removed in the etching process corresponds to a gate pattern of MOSFET cell 150.

In FIG. 4e, a portion of polysilicon layer 154 is removed by an etching process using photoresist layer 156 as a mask. A remaining portion of polysilicon layer 154 serves as a polysilicon (poly) gate for MOSFET cell 150. Poly gate 154 will be electrically connected to a gate terminal of the final MOSFET device. Electric charge applied to poly gate 154 will control the conductivity of a channel in base substrate material 122 between subsequently formed source and drain regions. Because MOSFET cell 150 is an N-MOS device, a positive voltage applied to poly gate 154 turns on the MOSFET cell. The positive voltage on poly gate 154 will create an electric field through dielectric layer 152 to attract electrons, i.e., majority carriers, to an area in base substrate material 122 under the poly gate, thereby creating a conduction channel.

In FIG. 4f, a remaining portion of photoresist layer 156 is removed after the etching of polysilicon layer 154. Dielectric layer 152 remains as a protective layer over MOSFET cell 150. In some embodiments, portions of dielectric layer 152 are removed. Dielectric layer 152 between poly gate 154 and base substrate material 122 acts as a gate dielectric or gate oxide for MOSFET cell 150. Dielectric layer 152 prevents direct electrical contact between poly gate 154 and base substrate material 122 while allowing an electric field from the poly gate to penetrate the base substrate material to create a conduction channel. FIG. 4g shows a 3D perspective view of base substrate material 122, dielectric layer 152, and poly gate 154. Poly gate 154 extends across MOSFET cell 150 over active surface 130. Poly gate 154 is formed as a uniform strip across MOSFET cell 150. Other shapes of poly gate 154 are used in other embodiments. Dielectric layer 152 remains blanketed over active surface 130.

FIG. 4h illustrates photoresist layer 158 formed over dielectric layer 152 and poly gate 154. A portion of photoresist layer 158 corresponding to a drain region of MOSFET cell 150 is removed using an etching or photolithography process. A semiconductor doping process, e.g., ion implantation, is used to deposit an N-type dopant, such as phosphorus, antimony, or arsenic, into base substrate material 122 to form LDD region 160. Ion implantation is used to implant dopant material through dielectric layer 152 by accounting for the thickness of the dielectric layer when selecting the energy level of the ion implantation.

Photoresist layer 158 acts as a mask to form LDD region 160 in the desired location for a drift region on active surface 130. In other embodiments, LDD region 160 is self-aligned using poly gate 154. LDD region 160 is a lightly doped region which conducts electricity from a subsequently formed drain contact region to an area under poly gate 154. LDD region 160 forms a PN junction, including a depletion region, at areas of contact with P-doped base substrate material 122. A remaining portion of photoresist layer 158 is removed after LDD region 160 is formed. LDD region 160 is formed extending across MOSFET cell 150 in parallel with poly gate 154, as shown in FIG. 4p.

In FIG. 4i, photoresist layer 168 is formed over dielectric layer 152, poly gate 154, and LDD region 160. A portion of photoresist layer 168 corresponding to a source region of MOSFET cell 150 is removed using an etching or photolithography process. A semiconductor doping process, e.g., ion implantation, is used to deposit a P-type dopant, such as boron, aluminum, or gallium, into base substrate material 122 to form P-channel region 170. P-channel region 170 is formed extending across MOSFET cell 150 in parallel with poly gate 154.

Photoresist layer 168 acts as a mask to form P-channel region 170 in the region of base substrate material 122 desired as a source region, and limits the amount of P-type dopant deposited into LDD region 160. In other embodiments, P-channel region 170 is formed self-aligned with poly gate 154. A thermal anneal process is performed on MOSFET cell 150 to extend P-channel region 170 laterally under poly gate 154. In some embodiments, P-channel region 170 contacts LDD region 160 under poly gate 154.

P-channel region 170 is used to control the turn-on voltage of MOSFET cell 150. Due to P-channel region 170 being more heavily doped than base substrate material 122, more electrons will be required in a channel under poly gate 154 to turn on MOSFET cell 150 as the P-channel region extends further under the poly gate.

P-channel region 170 serves as a conduction path through MOSFET cell 150 which is doped with a higher concentration than base substrate material 122, reducing resistance for positive carriers, i.e., holes, while MOSFET cell 150 is in avalanche or during commutation of the MOSFET cell. P-channel region 170 also slows the spread of the depletion region between base substrate material 122 and LDD region 160 toward a subsequently formed source contact region as the depletion region extends further into the base substrate material. P-channel region 170 reduces the likelihood of the depletion region reaching the N+ doped source contact region. A remaining portion of photoresist layer 168 is removed after P-channel region 170 is formed.

In FIG. 4j, photoresist layer 172 is formed over dielectric layer 152, poly gate 154, LDD region 160, and P-channel region 170. A portion of photoresist layer 172 corresponding to a P+ source contact region of MOSFET cell 150 is removed using an etching or photolithography process. A semiconductor doping process, e.g., ion implantation, is used to deposit a P-type dopant, such as boron, aluminum, or gallium, into P-channel region 170 to form P+ source contact region 174.

P+ source contact region 174 is formed extending across MOSFET cell 150 in parallel with poly gate 154, as shown in FIG. 4p.

P+ source contact region 174 creates a heavily doped region within P-channel region 170 to provide good ohmic contact between a subsequently formed metal source contact and base substrate material 122. A remaining portion of photoresist layer 172 is removed after formation of P+ source contact region 174.

FIG. 4k illustrates photoresist layer 176 formed over dielectric layer 152, poly gate 154, LDD region 160, P-channel region 170, and P+ source contact region 174. A portion of photoresist layer 176 corresponding to N+ source and drain contact regions is removed using an etching or photolithography process. A semiconductor doping process, e.g., ion implantation, is used to deposit an N-type dopant, such as arsenic, phosphorus, or antimony, into P-channel region 170 and LDD region 160 to form N+ source contact region 178 and N+ drain contact region 180. N+ source contact region 178 and N+ drain contact region 180 are each formed extending across MOSFET cell 150 in parallel with poly gate 154, as shown in FIG. 4p. In one embodiment, a first mask is used to form N+ source contact region 178, and a second mask is used to form N+ drain contact region 180 in a separate deposition step.

N+ source contact region 178 serves as a first connection point for power current through MOSFET cell 150 when the MOSFET cell is on. N+ source contact region 178 creates a good ohmic connection with a metal source contact subsequently formed over MOSFET cell 150. N+ drain contact region 180 serves as a second connection point for power current through MOSFET cell 150 when the MOSFET cell is on. N+ drain contact region 180 creates a good ohmic connection between LDD region 160 and a metal drain contact subsequently formed over MOSFET cell 150.

A metal source contact subsequently formed over MOSFET cell 150 is connected to N+ source contact region 178 and P+ source contact region 174. The metal source contact is connected to N+ source contact region 178 as a conduction terminal through MOSFET cell 150 when the MOSFET cell is on. A positive charge applied to poly gate 154 attracts electrons to the area of base substrate material 122 under poly gate 154. A channel of negative carriers is created connecting N+ source contact region 178 and LDD region 160, which is negatively doped as well, allowing current to flow from N+ drain contact region 180 to N+ source contact region 178.

The metal source contact subsequently formed over MOSFET cell 150 is connected to P+ source contact region 174 in order to control the voltage of base substrate material 122. MOSFET cell 150 includes a parasitic NPN BJT transistor formed by N+ source contact region 178, P-doped base substrate material 122, and N-doped LDD region 160. Without a connection between a metal source contact and base substrate material 122 through P+ source contact region 174, the base substrate material, i.e., the base of the parasitic BJT, is electrically floating. Under certain circumstances, the parasitic BJT activates and causes latch-up of MOSFET cell 150. Connecting the metal source contact to base substrate material 122 reduces the likelihood of latch-up, and creates a diode between P+ source contact region 174 and N+ drain contact region 180 of MOSFET cell 150. When MOSFET cell 150 is off, current from the voltage applied to N+ drain contact region 180 is limited by the diode formed between the N+ drain contact region and P+ source contact region 174. In some embodiments, a voltage greater than BVdss applied to N+ drain contact region 180 puts the MOSFET cell into avalanche. When MOSFET cell 150 is in avalanche, the electric field in base substrate material 122 is strong enough to generate pairs of holes and electrons. The generated holes flow out P+ source contact region 174, and the generated electrons flow out N+ drain contact region 180.

In FIG. 4l, photoresist layer 188 is formed over dielectric layer 152 and poly gate 154. A portion of photoresist layer 188 corresponding to a superjunction region is removed using an etching or photolithography process. A semiconductor doping process, e.g., ion implantation, is used to deposit an N-type dopant, such as arsenic, phosphorus, or antimony, into LDD region 160 to form N-drift region 190. A plurality of ion implantation steps, or chain implants, is used to reach a desired superjunction depth, Xj. Each subsequent implant is performed with a varied ion energy to inject dopant to a different depth between surface 130 and a depth of Xj into base substrate material 122. In one embodiment, two chain implants are performed per 0.50 µm of desired depth into base substrate material 122.

In FIG. 4l, a first chain implant 190a is performed which deposits N-type dopant to a depth of Xj. A second chain implant 190b is performed which deposits N-type dopant between chain implant 190a and surface 130. A thermal anneal performed after MOSFET cell 150 is formed diffuses chain implants 190a and 190b into continuous and uniform vertical regions. In other embodiments, chain implants are not used and a single ion implantation is used to form N-drift region 190.

N-drift region 190 is formed as a band across MOSFET cell 150. N-drift region 190 extends across MOSFET cell 150 in parallel with poly gate 154. FIG. 4m illustrates a plan view of MOSFET cell 150 without dielectric layer 152, so N-drift region 190 is visible. Photoresist layer 188 is formed over MOSFET cell 150, with a portion of the photoresist layer removed to allow formation of N-drift region 190 across MOSFET cell 150. N-drift region 190 is formed with a length corresponding to the desired length, Lsj, of superjunction stripes for MOSFET cell 150 and a width which extends across the MOSFET cell. A remaining portion of photoresist layer 188 is removed after N-drift region 190 is formed.

In FIG. 4n, photoresist layer 198 is formed over dielectric layer 152 and poly gate 154. A portion of photoresist layer 198 corresponding to a P-doped stripe area of a superjunction is removed using an etching or photolithography process. A semiconductor doping process, e.g., ion implantation, is used to deposit a P-type dopant, such as boron, aluminum, or gallium, into N-drift region 190 to form P-doped stripes 200. P-doped stripes 200 are formed to approximately the same depth, Xj, as N-drift region 190. In embodiments where chain implants are used to increase the depth of N-drift region 190, similar chain implants with similar ion energies are used to align the depth of P-doped stripes 200 to the depth of the N-drift region.

FIG. 4n illustrates a first chain implant 200a which deposits P-type dopant to a depth of Xj. A second chain implant 200b is performed which deposits P-type dopant between chain implant 200a and surface 130. A thermal anneal performed after MOSFET cell 150 is formed diffuses chain implants 200a and 200b into continuous and uniform vertical regions.

FIG. 4o illustrates a plan view of MOSFET cell 150 without dielectric layer 152, so that P-doped stripes 200 are visible. Photoresist layer 198 is formed over MOSFET cell 150, with a portion of the photoresist layer removed to allow formation of P-doped stripes 200 in N-drift region 190. Photoresist layer 198 forms a mask, such that P-doped stripes 200 are formed with a length approximately equal to the N-drift region 190, Lsj. Each P-doped stripe 200 is formed with approximately the same depth into base substrate material 122, Xj, as N-drift region 190. Each individual P-doped stripe 200 is formed with a width, Wp, as determined by the design parameters of the superjunction. Each individual P-doped stripe 200 is spaced apart from an adjacent P-doped stripe by a distance of Wn, as determined by the design parameters of the superjunction. The area between adjacent P-doped stripes 200 remains covered by photoresist layer 198 so that portions of N-drift region 190 remain N-doped. The mask pattern of photoresist 198 over N-drift region 190 protects portions of the N-drift region from being doped along with P-doped stripes 200.

Wn is the desired width of N-doped stripes of the superjunction. Leaving photoresist layer 198 as a mask between adjacent P-doped stripes 200 causes the deposition of P-type dopant to form the P-doped stripes while leaving portions of N-drift region 190 as stripes having a negative doping. Enough P-type dopant is deposited in P-doped stripes 200 to counteract the preexisting N-type doping, as well as reach the desired level of P-type doping in the P-doped stripes. The remaining N-doped stripes 190 are interleaved with P-doped stripes 200.

The described process of forming P-doped stripes 200 on a field of N-doped material self-aligns the P-doped stripes to N-doped stripes 190. An edge of each P-doped stripe 200 contacts an edge of adjacent N-doped stripes 190 to create the necessary PN junction and depletion region between each P-doped stripe and N-doped stripe. No excess space exists in base substrate material 122 between N-doped stripes 190 and P-doped stripes 200 because the P-doped stripes are formed self-aligned to a common boundary with the N-doped stripes.

In one embodiment, Wn and Wp are approximately equal. In the case where Wn and Wp, i.e., the widths of N-doped stripes 190 and P-doped stripes 200, are approximately equal, the doping concentrations of the stripes are also made approximately equal. With equal widths and equal doping concentrations, a depletion region between an N-doped stripe 190 and adjacent P-doped stripe 200 grows into the N-doped and P-doped stripe at approximately the same rate. N-doped stripes 190 are fully depleted at approximately the same voltage at which P-doped stripes 200 are fully depleted, which improves the benefit of the superjunction to BVdss. In other embodiments, the width of N-doped stripes 190, Wn, and the width of P-doped stripes 200, Wp, are different values. When Wn is greater than Wp, the doping concentration of N-doped stripes 190 is made lower than the doping concentration of P-doped stripes 200 in order to maintain proper charge balancing between the P-doped stripes and N-doped stripes. When Wn is less than Wp, the doping concentration of N-doped stripes 190 is made greater than the doping concentration of P-doped stripes 200 to maintain proper charge balancing. When N-doped stripes 190 are properly charge balanced with P-doped stripes 200, the N-doped stripes are fully depleted at the same voltage at which the P-doped stripes are fully depleted, even with different widths Wn and Wp. Charge balancing occurs when the product of the doping concentration of N-doped stripes 190 and the width of the N-doped stripes, Wn, is equal to the product of the doping concentration of P-doped stripes 200 and the width of the P-doped stripes, Wp. The depth of stripes 190 and 200, Xj, is not factored into the charge balancing of a superjunction if the depth of each stripe is equal.

FIG. 4p illustrates MOSFET cell 150 with photoresist layer 198 removed. Dielectric layer 152 is illustrated as being partially removed to better illustrate the doping areas of active surface 130. When a positive charge is exhibited on poly gate 154, negative carriers, i.e., electrons, are attracted to the area of P-channel region 170 and base substrate material 122 under the poly gate. When the positive charge on poly gate 154 is of a high enough magnitude, electrons attracted under the poly gate electrically connect N+ source contact region 178 and LDD region 160. Due to the conduction path of electrons under poly gate 154, a path of negative carriers is continuous from N+ drain contact region 180, through LDD region 160 and N-doped stripes 190, and to N+ source contact region 178. LDD region 160 electrically connects the channel formed under poly gate 154 to one end of N-doped stripes 190. LDD region 160 also electrically connects a second end of N-doped stripes 190 to N+ drain contact region 180.

Current through P-doped stripes 200 when MOSFET cell 150 is on is limited because of a depletion region formed between the P-doped stripes and N-doped stripes 190. However, RDSON of MOSFET cell 150 is reduced compared to a drift region using only LDD region 160 due to the higher doping concentration of stripes 190 compared to the LDD region. When MOSFET cell 150 is on, current flows from a power signal connected to N+ drain contact region 180, through the portion of LDD region 160 adjacent to the N+ drain contact region, and through the N-doped stripes. Current continues through the portion of LDD region 160 between N-doped stripes 190 and poly gate 154, then through a conductive channel formed under poly gate 154 to N+ source contact region 178. The electronic circuit to be switched is connected to N+ source contact region 178 to receive the power signal. In other configurations, N+ source contact region 178 is connected to a ground potential, while the circuit to be switched is connected in series between N+ drain contact region 180 and a power source.

When MOSFET cell 150 is off, i.e., insufficient positive charge exists on poly gate 154 to form a conduction channel under the poly gate, N+ source contact region 178 and LDD region 160 are not electrically connected. The power signal at N+ drain contact region 180 does not flow through MOSFET cell 150 to N+ source contact region 178. The PN junctions between N-doped stripes 190, P-doped stripes 200, LDD region 160, and base substrate material 122 create a diode with N+ drain contact region 180 as the cathode and P+ source contact region 174 as the anode. The identified diode limits current from N+ drain contact region 180 to P+ source contact region 174 until the voltage on the N+ drain contact region reaches the breakdown voltage of the diode.

N-doped stripes 190 form superjunction 202 with P-doped stripes 200. Superjunction 202 is surrounded by LDD region 160. LDD region 160 exists below and at the ends of each N-doped stripe 190 and P-doped stripe 200. Together, superjunction 202 and LDD region 160 form a drift region of MOSFET cell 150. The superjunction formed by stripes 190 and 200 provides a low resistance conduction path between drain contact region 180 and gate 154. LDD region 160 provides a buffer area between superjunction 202 and N+ drain contact region 180, as well as between the superjunction and the area under poly gate 154.

Due to the increased doping concentrations of stripes 190 and 200, an increased electric field exists at the depletion region between adjacent stripes compared to the depletion region between LDD region 160 and base substrate material 122 when superjunction 202 is not used. LDD region 160 acts as a buffer area between the higher electric fields of depletion regions of superjunction 202 and electric field peaks at N+ drain contact region 180 and under poly gate 154. Limiting the electric field at N+ drain contact region 180 and under poly gate 154 increases BVdss and reduces the likelihood of hot carriers being injected into dielectric layer 152.

Accordingly, stripes 190 and 200 are formed such that some distance is provided between the stripes and N+ drain contact region 180 to buffer the N+ drain contact region from increased electric fields. A distance is also provided between poly gate 154 and stripes 190 and 200 to buffer the poly gate from increased electric fields.

LDD region 160 is provided to complete a conduction path between N+ drain contact region 180 and N-doped stripes 190. Without LDD region 160, N+ drain contact region 180 is surrounded by P-doped base substrate 122. A depletion region forms surrounding N+ drain contact region 180, reducing current flow through MOSFET cell 150. LDD region 160 provides a negatively doped region between N+ drain contact region 180 and N-doped stripes 190 for proper conduction through the drift region when MOSFET cell 150 is on.

LDD region 160 also completes a conduction path between N-doped stripes 190 and the area under poly gate 154. A positive charge on poly gate 154 attracts electrons to the area under the poly gate, creating a conductive channel connecting N+ source contact region 178 and LDD region 160. The conduction channel under poly gate 154 does not easily reach N-doped stripes 190 as required for conduction through MOSFET cell 150. LDD region 160 of MOSFET cell 150 bridges the gap between N-doped stripes 190 and poly gate 154.

LDD region 160 provides a buffer area between N+ drain contact region 180 and the increased electric field of stripes 190 and 200. LDD region 160 also provides a buffer area between poly gate 154 and the increased electric field of stripes 190 and 200. LDD region 160 is doped with negative carriers, and operates as short segments of the drift region formed by the LDD region and superjunction 202. Together, LDD region 160, N-doped stripes 190, and P-doped stripes 200 form a drift region of MOSFET cell 150 connecting N+ drain contact region 180 to the area under poly gate 154. N-doped stripes 190 and P-doped stripes 200 form superjunction 202 which provides a low resistance conduction path, while also supporting a high BVdss. LDD region 160 provides a buffer area to prevent higher electric fields of superjunction 202 from combining with electric field peaks at the area under poly gate 154 or N+ drain contact region 180.

While the doped regions in base substrate material 122 are illustrated as being formed in one order, the various regions are doped in a different order of steps in other embodiments.

FIGS. 5a-5h show, in relation to FIGS. 4a-4p, a hard mask method of forming power MOSFET cell 210 with a superjunction and surrounding LDD region. Typically, a plurality of MOSFET cells 210 is formed on active surface 130, and connected in parallel, to create a power MOSFET device. MOSFET cell 210 is used in semiconductor designs other than a discrete power MOSFET in other embodiments.

Continuing from FIG. 4k, FIG. 5a illustrates photoresist layer 218 formed over dielectric layer 152 and poly gate 154. A portion of photoresist layer 218 corresponding to a superjunction region is removed using an etching or photolithography process. A semiconductor doping process, e.g., ion implantation, is used to deposit an N-type dopant, such as arsenic, phosphorus, or antimony, into LDD region 160 to form N-drift region 220. In some embodiments, a plurality of ion implantation steps, or chain implants, is used to reach a desired superjunction depth, Xj. Each subsequent implant is performed with a varied ion energy to inject dopant to a different depth between surface 130 and a depth of Xj into base substrate material 122. In one embodiment, two chain implants are performed per 0.50 μm of desired depth into base substrate material 122.

In FIG. 5a, three ion implants are used to form N-drift region 220 instead of two ion implants as with N-drift region 190 in FIG. 4l. A first chain implant 220a is performed which deposits N-type dopant to a depth of Xj. A second chain implant 220b is performed which deposits N-type dopant over implant 220a and extending partially to surface 130. A third chain implant 220c is performed which deposits N-type dopant between chain implant 220b and surface 130. A thermal anneal performed after MOSFET cell 210 is formed diffuses ion implants 220a, 220b, and 220c into a vertically continuous and uniform region.

N-drift region 220 is formed as a band across MOSFET cell 210. N-drift region 220 extends across MOSFET cell 210 in parallel with poly gate 154. N-drift region 220 is formed deeper into base substrate material 122 than N-drift region 190 in FIG. 4l. A hard mask used to form the P-doped stripes of a superjunction in N-drift region 220 allows for a higher energy ion implantation which reaches an increased depth within base substrate material 122. Because the hard mask allows P-doped stripes to be formed to a greater depth, i.e., higher Xj, N-drift region 220 are formed to a greater depth as well.

FIG. 5b illustrates a plan view of MOSFET cell 210 without dielectric layer 152, so N-drift region 220 is visible. Photoresist layer 218 is formed over MOSFET cell 210 with a portion of the photoresist layer removed to allow formation of N-drift region 220 across MOSFET cell 210. N-drift region 220 is formed with a length corresponding to the desired length, Lsj, of superjunction stripes for MOSFET cell 210 and a width which extends across the MOSFET cell. A remaining portion of photoresist layer 218 is removed after N-drift region 220 is formed.

Figure 5C:
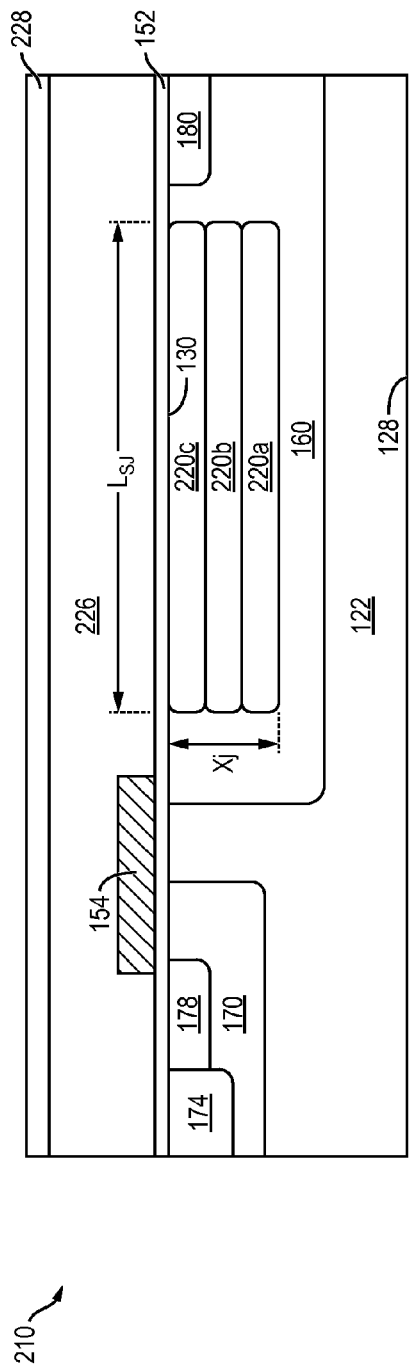

In FIG. 5c, hard mask 226 is deposited over active surface 130, dielectric layer 152, and poly gate 154. Hard mask 226 is formed from a hard mask material, e.g., SiO2. In one embodiment, a thickness of hard mask 226 is adjusted according to the desired implant depth, Xj. A surface of hard mask 226 opposite active surface 130 undergoes a planarization process such as chemical-mechanical planarization (CMP). Photoresist layer 228 is formed over hard mask 226.

Figure 5D:
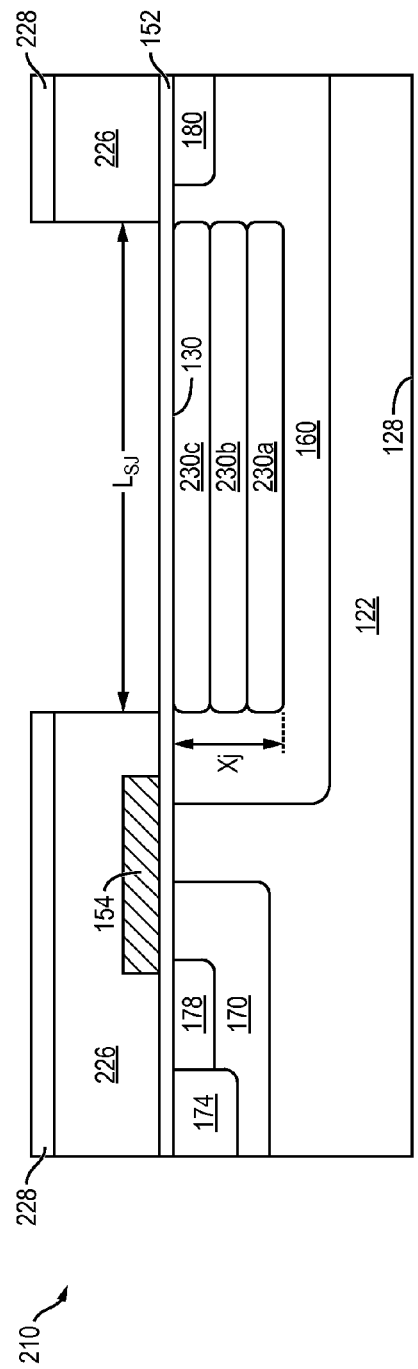

FIG. 5d illustrates removing a portion of photoresist layer 228 and hard mask 226 corresponding to a desired location for subsequently formed P-doped stripes of a superjunction. First, a portion of photoresist layer 228 is removed by an etching or photolithography process in the desired superjunction pattern. Next, a portion of hard mask 226 is removed by an etching process using photoresist layer 228 as a mask, thereby creating a similar pattern in hard mask 226 as was formed in photoresist layer 228.

A semiconductor doping process, e.g., ion implantation, is used to deposit a P-type dopant, such as boron, aluminum, or gallium, into N-drift region 220 to form P-doped stripes 230. P-doped stripes 230 are formed to approximately the same depth, Xj, as N-drift region 220. In embodiments where chain implants are used to increase the depth of N-drift region 220, similar chain implants with similar ion energies are used to align the depth of P-doped stripes 230 to the depth of the N-drift region.

P-doped stripes 230 are formed using hard mask 226 as a mask instead of photoresist layer 198 as with P-doped stripes 200 in FIG. 4n. Hard mask 226 allows for a higher resolution pattern to be formed due to the ability of the hard mask to withstand higher energy ion implantation. Higher resolution patterning allows thinner N-doped stripes 220 and P-doped stripes 230, i.e., lower Wn and Wp. Lower widths Wn and Wp allow for a higher doping concentration of the superjunction of power MOSFET cell 210 while N-doped stripes 220 and P-doped stripes 230 still fully deplete prior to breakdown of MOSFET cell 210. A higher doping concentration of N-doped stripes 220 and P-doped stripes 230 reduces RDSON of MOSFET cell 210. Therefore, using hard mask 226 instead of photoresist layer 198 in FIG. 4n allows for a deeper superjunction and lower stripe widths, reducing RDSON. Conduction losses of MOSFET cell 210 are reduced by the reduction of RDSON.

Figure 5E:
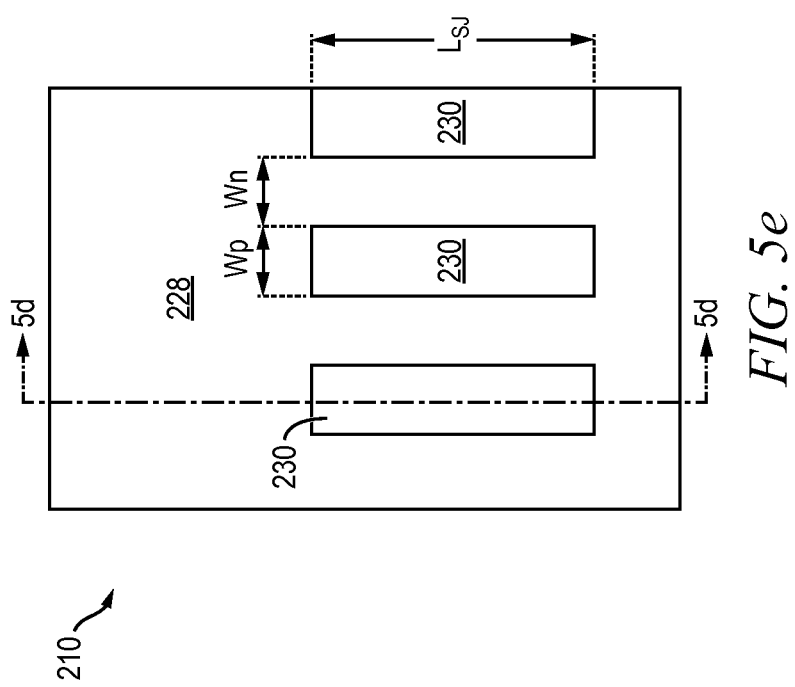

FIG. 5e illustrates a plan view of MOSFET cell 210 without dielectric layer 152, so that P-doped stripes 230 are visible. Hard mask 226 and photoresist layer 228 are formed over MOSFET cell 210, with portions of the photoresist layer and hard mask removed for formation of P-doped stripes 230 in N-drift region 220. Photoresist layer 228 forms a mask to etch hard mask 226. Hard mask 226 is etched to form a mask used for formation of P-doped stripes 230. P-doped stripes 230 are formed with a length approximately equal to the N-drift region 220, i.e., Lsj. Each P-doped stripe 230 is formed with approximately the same depth into base substrate material 122, i.e., Xj, as N-drift region 220. Each individual P-doped stripe 230 is formed with a width, Wp, as determined by the design parameters of the superjunction. Each individual P-doped stripe 230 is separated from an adjacent P-doped stripe by a distance of Wn, as determined by the design parameters of the superjunction. The area between adjacent P-doped stripes 230 remains covered by hard mask 226 so that portions of N-drift region 220 are not doped along with the P-doped stripes. The use of hard mask 226 allows for a lower Wn and Wp to be used.

Wn is the desired width of N-doped stripes of the superjunction. Leaving hard mask 226 as a mask between adjacent P-doped stripes 230 causes the deposition of P-type dopant to form the P-doped stripes while leaving portions of N-drift region 220 as stripes having a negative doping. Enough P-type dopant is deposited in P-doped stripes 230 to counteract the preexisting N-type doping, as well as reach the desired level of P-type doping in the P-doped stripes. The remaining N-doped stripes 220 are interleaved with P-doped stripes 230.

The described process of forming P-doped stripes 230 on a field of N-doped material self-aligns the P-doped stripes to N-doped stripes 220. An edge of each P-doped stripe 230 contacts an edge of adjacent N-doped stripes 220 to properly create the necessary PN junction and depletion region between each P-doped stripe and N-doped stripe. No excess space exists in base substrate material 122 between N-doped stripes 220 and P-doped stripes 230 because the P-doped stripes are formed self-aligned to a common boundary with the N-doped stripes.

In one embodiment, Wn and Wp are approximately equal. In the case where Wn and Wp, i.e., the widths of N-doped stripes 220 and P-doped stripes 230, are approximately equal, the doping concentrations of the stripes are also made approximately equal. With equal widths and equal doping concentrations, a depletion region between an N-doped stripe 220 and adjacent P-doped stripe 230 grows into the N-doped stripe and P-doped stripe at approximately the same rate. N-doped stripes 220 are fully depleted at approximately the same voltage level as P-doped stripes 230, which improves performance of the superjunction. In other embodiments, the width of N-doped stripes 220, Wn, and the width of P-doped stripes 230, Wp, are selected to be different values. When Wn is greater than Wp, the doping concentration of N-doped stripes 220 is made lower than the doping concentration of P-doped stripes 230 in order to maintain proper charge balancing between the P-doped stripes and N-doped stripes. When Wn is less than Wp, the doping concentration of N-doped stripes 220 is made greater than the doping concentration of P-doped stripes 230 to maintain proper charge balancing. When N-doped stripes 220 are properly charge balanced with P-doped stripes 230, the N-doped stripes are fully depleted at the same voltage as the P-doped stripes, even with different stripe widths.

Figure 5F:
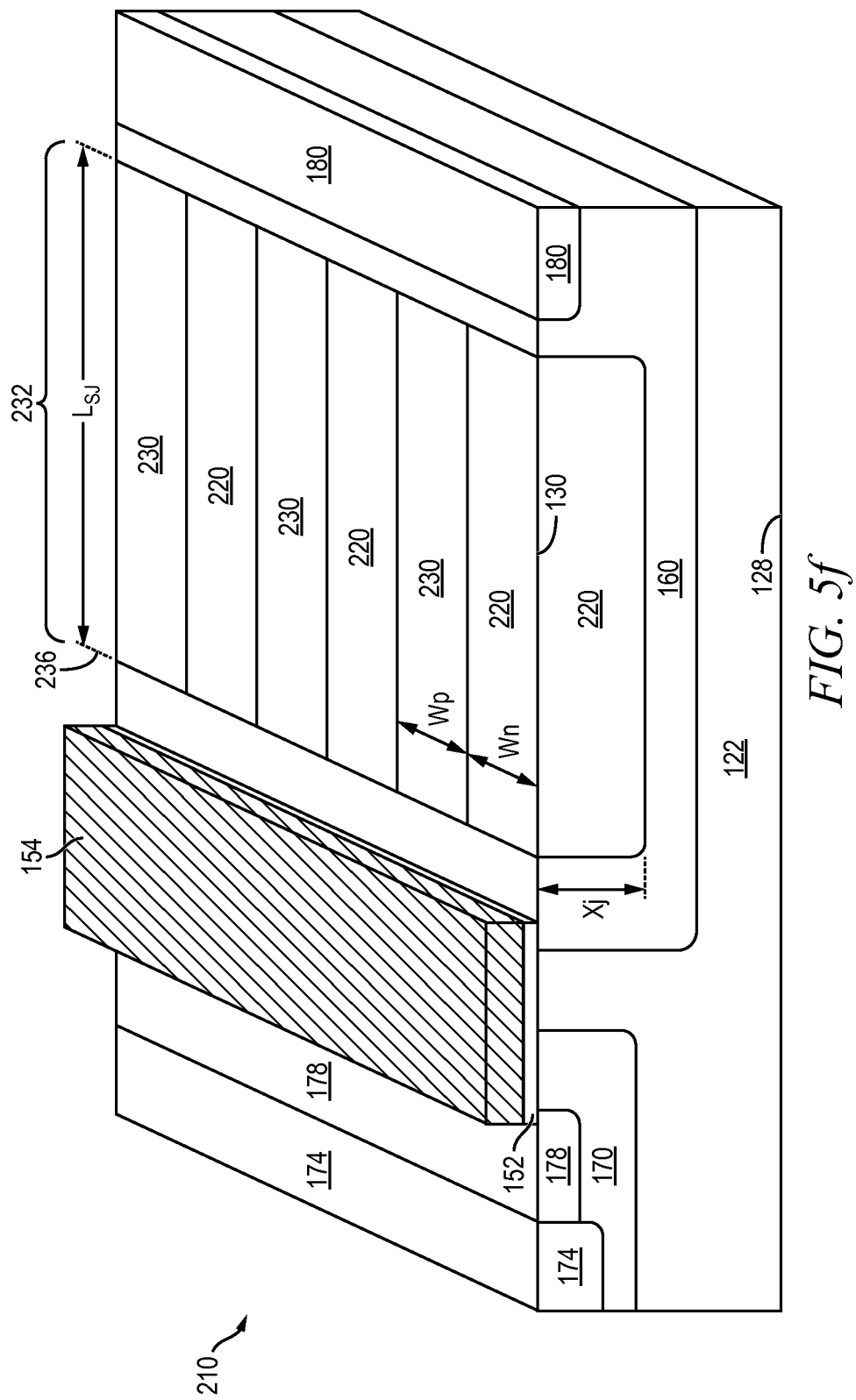

FIG. 5f illustrates MOSFET cell 210 with photoresist layer 228 and hard mask 226 removed. Dielectric layer 152 is illustrated as being partially removed to better illustrate the doping areas of active surface 130. N-doped stripes 220 and P-doped stripes 230 are doped at a higher concentration, formed with lower widths Wn and Wp, and include a deeper junction depth Xj than MOSFET cell 150 in FIG. 4p to give MOSFET cell 210 a lower RDSON. Other than the formation of P-doped stripes 230 using a hard mask instead of a soft mask, MOSFET cell 210 is formed and operates similarly to MOSFET cell 150. Hard mask 226 withstands a higher energy of ion implantation as compared to a soft mask. Higher energy ion implantation enables a higher resolution of stripes to be formed for superjunction 232 compared with superjunction 202, lowering Wn and Wp. Lowering Wn and Wp allows the doping concentrations of N-doped stripes 220 and P-doped stripes 230 to be increased because the stripes will still fully deplete before breakdown voltage of MOSFET cell 210 is reached. Higher energy ion implantation also allows a deeper implantation into base substrate material 122, thereby increasing Xj and reducing RDSON. Using hard mask 226 allows RDSON to be reduced by increasing junction depth, Xj, and reducing stripe width, Wn and Wp, of superjunction 232.

FIG. 5f illustrates the ideal case where the ends of N-doped stripes 220 and P-doped stripes 230 are aligned along line 236. One difficulty of manufacturing superjunction 202 of MOSFET cell 150 and superjunction 232 of MOSFET cell 210 is achieving proper alignment of the ends of the P-doped stripes with the ends of the N-doped stripes. The stripes of superjunctions 202 and 232 are self-aligned to each other by forming the P-doped stripes on a field of N-doped material. However, the ends of stripes 220 and 230 are not self-aligned. Aligning the ends of the N-doped stripes and P-doped stripes of a superjunction is important for charge balancing of the superjunction and improving characteristics of a MOSFET cell. Misalignment of N-doped stripes and P-doped stripes at the source end of the superjunction reduces BVdss. Due to alignment tolerances of the manufacturing equipment and processes used to form MOSFETs 150 and 210, it is difficult to achieve proper alignment of the ends of the P-doped stripes and N-doped stripes.

Figure 5G:
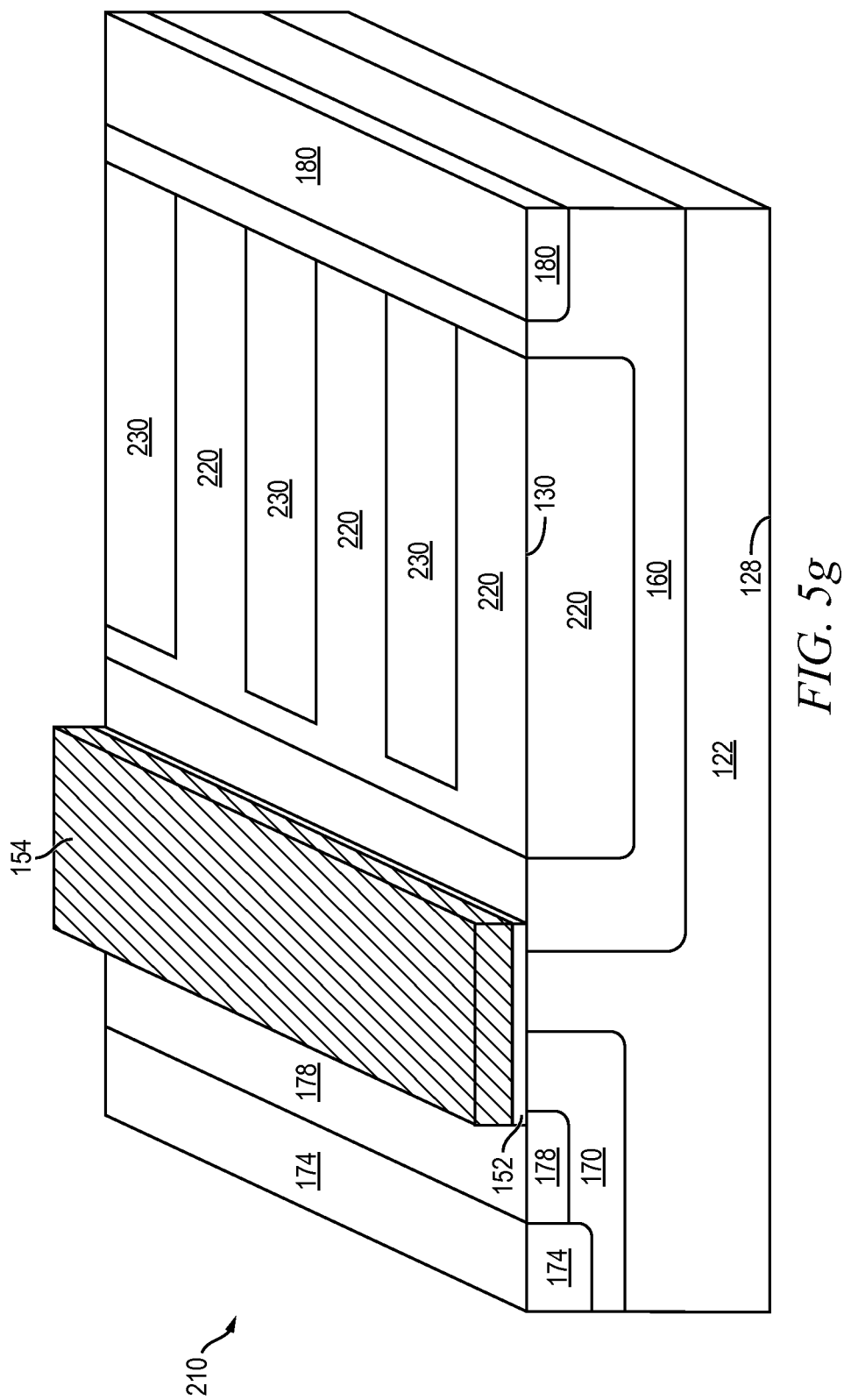

FIG. 5g illustrates one possible misalignment case. The edges of P-doped stripes 230 toward poly gate 154 are formed shorter than N-drift region 220, and are located within the N-drift region. When the source ends of P-doped stripes 230 are formed further away from poly gate 154 than the source end of N-drift region 220, BVdss is reduced. The variation in alignment of N-drift region 220 and P-doped stripes 230 is kept within the width of the stripes, Wn and Wp, to provide sufficient charge balancing. A larger value for Wn and Wp is used to ensure the misalignment between the ends of stripes 220 and 230 is less than Wn and Wp. Requiring a larger Wn and Wp limits the doping concentration used in N-doped stripes 220 and P-doped stripes 230, which raises RDSON of MOSFET cell 210.

Figure 5H:
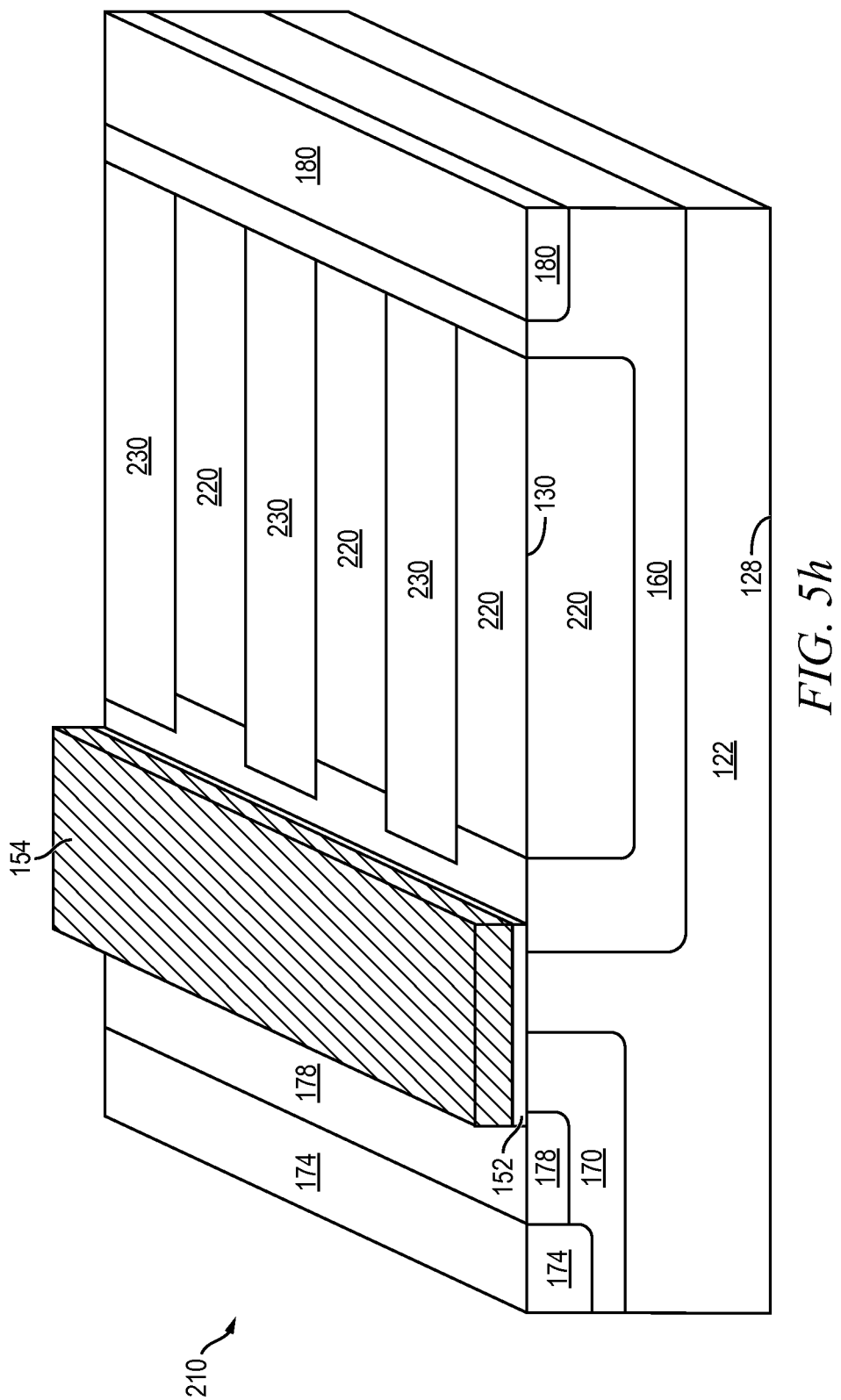

FIG. 5h illustrates a second possible misalignment case, with the edge of P-doped stripes 230 extending outside of N-drift region 230 toward poly gate 154. When the source ends of P-doped stripes 230 are formed closer to poly gate 154 than the source end of N-doped stripes 220, RDSON of MOSFET cell 210 is increased. Some of the conduction area of LDD region 160 is replaced by P-doped stripes 230 which conduct less current than the LDD region when MOSFET cell 210 is on. Reducing the conduction area of LDD region 160 adds resistance to the LDD region, increasing RDSON.

FIGS. 6a-6k illustrate, in relation to FIGS. 5a-5h, a hard mask method of forming MOSFET cell 250 with N-doped stripes and P-doped stripes including self-aligned lengths. Typically, a plurality of MOSFET cells 250 is formed on active surface 130, and connected in parallel, to create a power MOSFET device. MOSFET cell 250 is used in semiconductor designs other than a discrete power MOSFET in other embodiments.

Continuing from FIG. 4k, FIG. 6a illustrates hard mask 252, etch stop layer 254, and photoresist layer 256 formed over active surface 130, dielectric layer 152, and poly gate 154. Hard mask 252 is formed from SiO2 or another hard mask material. Etch stop layer 254 is formed from nitride, polysilicon, or another material with high etch selectivity with respect to hard mask 252.

FIG. 6b illustrates opening 258 formed in hard mask 252, etch stop layer 254, and photoresist layer 256. First, a portion of photoresist layer 256 corresponding to a superjunction area for MOSFET cell 250 is removed using an etching or photolithography process. Next, etch stop layer 254 and hard mask 252 are etched using photoresist layer 256 as a mask.

Figure 6C:
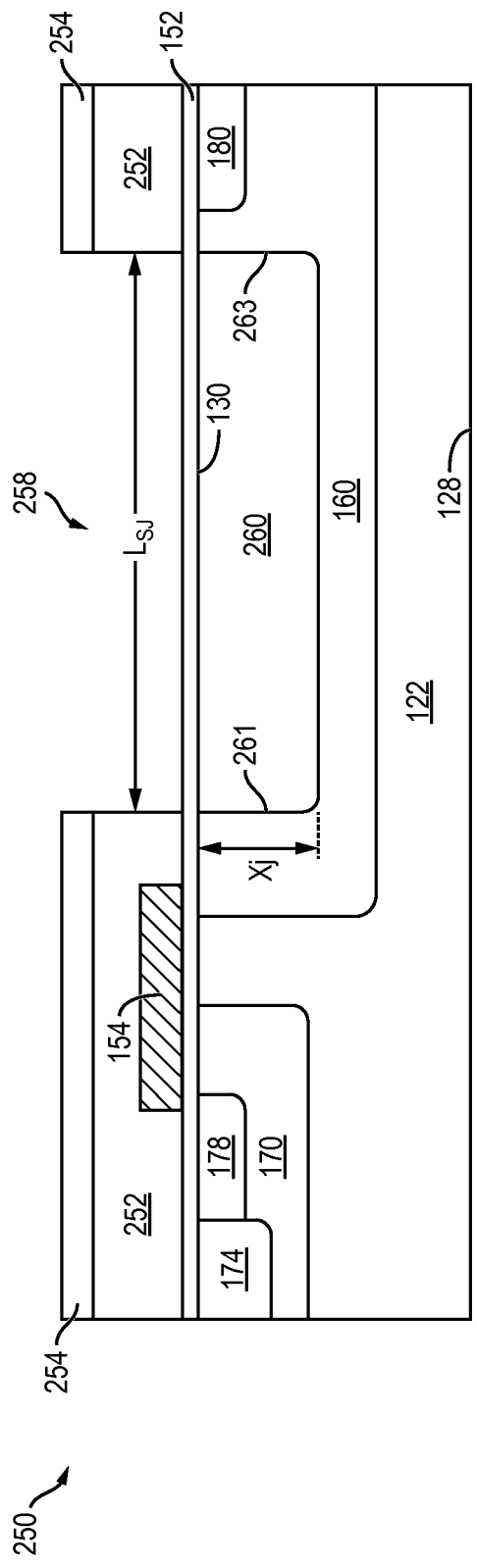

In FIG. 6c, a remaining portion of photoresist layer 256 is removed. A semiconductor doping process, e.g., ion implantation, is used to deposit an N-type dopant, such as arsenic, phosphorus, or antimony, into LDD region 160 to form N-drift region 260. In some embodiments, a plurality of ion implantation steps, or chain implants, is used to reach a desired superjunction depth, Xj. Each subsequent implant is performed with a varied ion energy to inject dopant to a different depth between surface 130 and a desired junction depth, Xj, into base substrate material 122. In one embodiment, two chain implants are performed per 0.50 µm of desired depth into base substrate material 122.

Figure 6D:
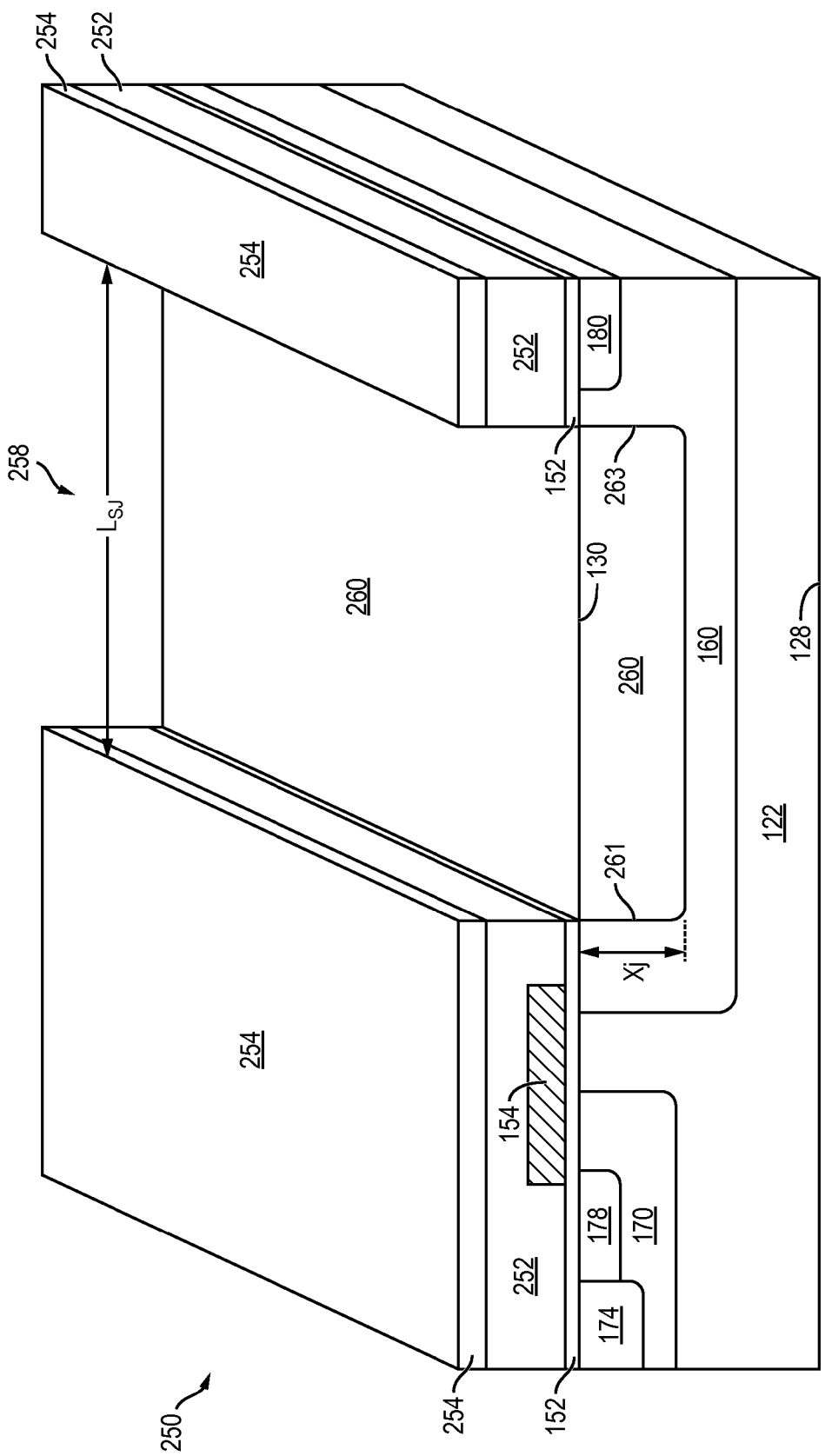

N-drift region 260 is formed as a band across MOSFET cell 250 using hard mask 252. N-drift region 260 extends across MOSFET cell 250 in parallel with poly gate 154. FIG. 6d illustrates a 3D perspective view of MOSFET cell 250 with opening 258, and with dielectric layer 152 partially removed to better illustrate N-drift region 260. Opening 258 is formed over MOSFET cell 250 to allow formation of N-drift region 260 across the MOSFET cell. N-drift region 260 is formed on active surface 130 through opening 258 with a length corresponding to the desired length, Lsj, of superjunction stripes for MOSFET cell 250 and a width extending across the MOSFET cell. N-drift region 260 is formed with an end or edge 261 toward poly gate 154 and an end or edge 263 toward N+ drain contact region 180.

FIG. 6e illustrates hard mask 264 and photoresist layer 266 formed over hard mask 252, etch stop layer 254, and dielectric layer 152. Hard mask 264 is formed from SiO2 or another hard mask material. A CMP or other planarization process is performed on hard mask 264 prior to forming photoresist layer 266.

FIG. 6f illustrates opening 268 formed in hard mask 264 and photoresist layer 266. First, a portion of photoresist layer 266 is removed corresponding to a desired pattern for subsequently formed P-doped stripes of a superjunction. Next, a portion of hard mask 264 is removed using photoresist layer 266 as a mask. Opening 268 in hard mask 264 and photoresist layer 266 extends lengthwise beyond the opening formed in hard mask 252 and etch stop layer 254. That is, the length of opening 268 is longer than the desired length of the superjunction, Lsj. Etch stop layer 254 protects hard mask 252 during the etching of hard mask 264. Opening 268 in hard mask 264 extends lengthwise past ends 261 and 263 of N-drift region 260.

Figure 6G:
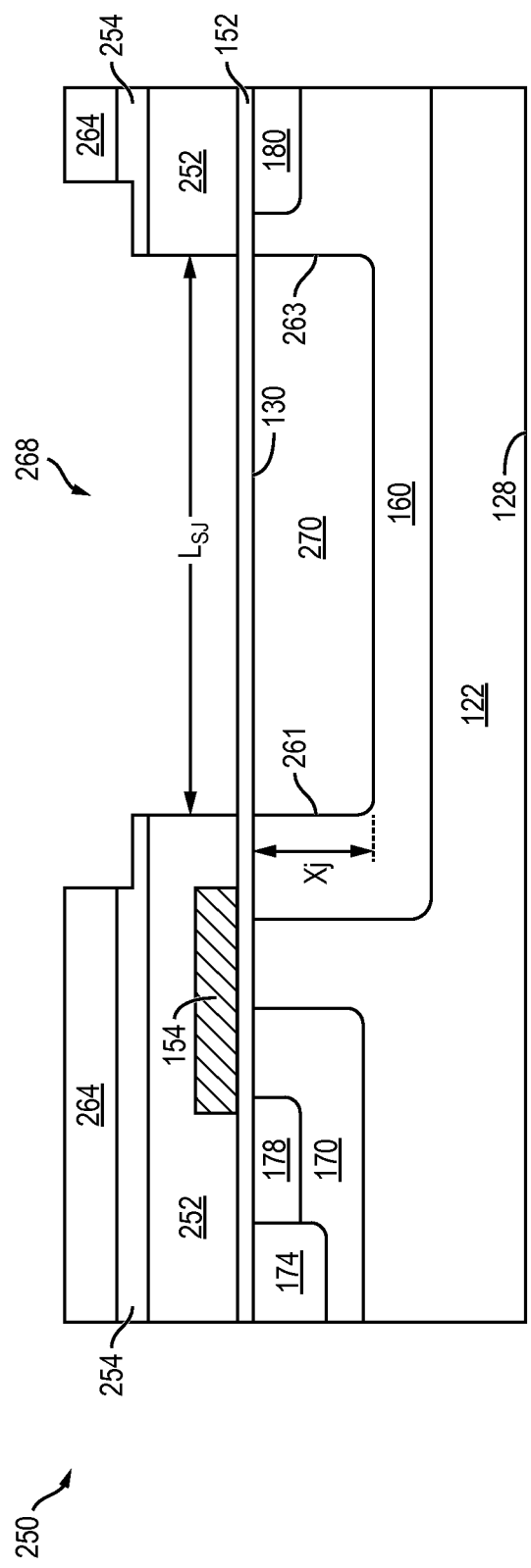

In FIG. 6g, a remaining portion of photoresist layer 266 is removed. A semiconductor doping process, e.g., ion implantation, is used to deposit a P-type dopant, such as boron, aluminum, or gallium, into N-drift region 260 to form P-doped stripes 270. P-doped stripes 270 are formed to approximately the same depth, Xj, as N-drift region 260. In embodiments where chain implants are used to increase the depth of N-drift region 260, similar chain implants with similar ion energies are used to align the depth of P-doped stripes 270 to the depth of the N-drift region. Hard mask 264 and hard mask 252 are used as masks in the formation of P-doped stripes 270. Hard mask 252 controls the length of P-doped stripes 270, while hard mask 264 controls the width of P-doped stripes 270 and the width of portions of N-drift region 260 which remain as N-doped stripes. A portion of hard mask 252 and a portion of hard mask 264 are used to form P-doped stripes 270.

Figure 6H:
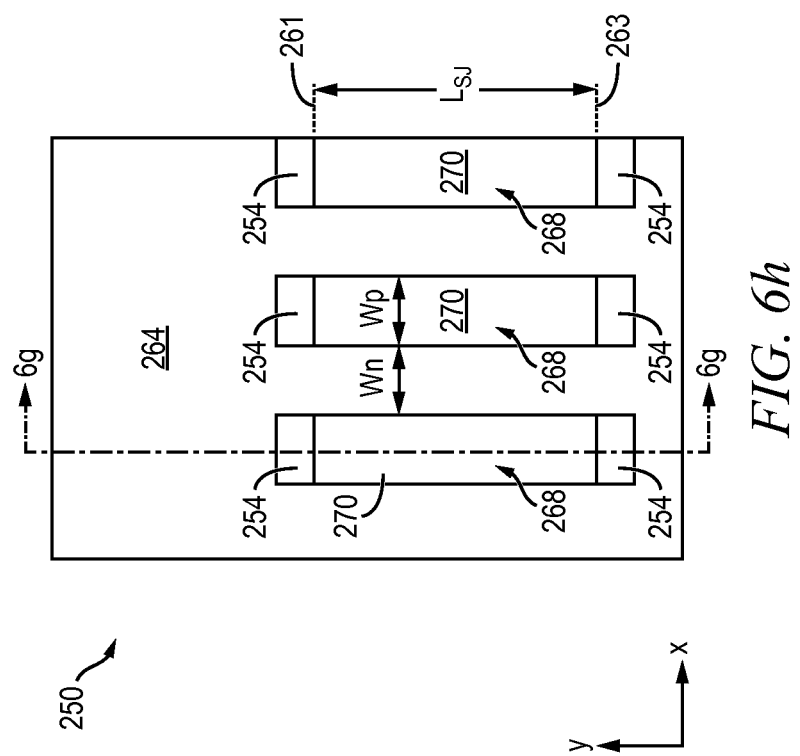

FIG. 6h illustrates a plan view of openings 268 formed over MOSFET cell 250. Dielectric layer 152 is not shown, in order to better illustrate the doping areas of MOSFET cell 250. Openings 268 extend over the edges of etch stop layer 254 and hard mask 252 such that portions of etch stop layer 254 are visible in openings 268. During formation of P-doped stripes 270, hard mask 264 defines the width of the P-doped stripes, Wp, and N-doped stripes 260, Wn. Hard mask 264 self-aligns P-doped stripes 270 to N-doped stripes 260 in the X direction, such that each P-doped stripe includes a common edge with two adjacent N-doped stripes, because the P-doped stripes are formed in a field of N-doped material. Hard mask 252 and etch stop layer 254 self-align the ends of P-doped stripes 270 with ends 261 and 263 of N-doped stripes 260 because hard mask 252 is used to form the ends of the P-doped stripes and N-doped stripes. Hard mask 264 is etched beyond hard mask 252 and etch stop layer 254 lengthwise, i.e., in the Y direction, beyond edges 261 and 263 so that hard mask 252 and etch stop layer 254 are used to define the length of P-doped stripes 270. The ends of P-doped stripes 270 and N-doped stripes 260 are self-aligned along lines 261 and 263 because hard mask 252 defines the length of the P-doped stripes and N-doped stripes. Hard mask 264 self-aligns N-doped stripes 260 and P-doped stripes 270 in the X direction, while hard mask 252 and etch stop layer 254 self-align the N-doped stripes and P-doped stripes in the Y direction.

Figure 6I:
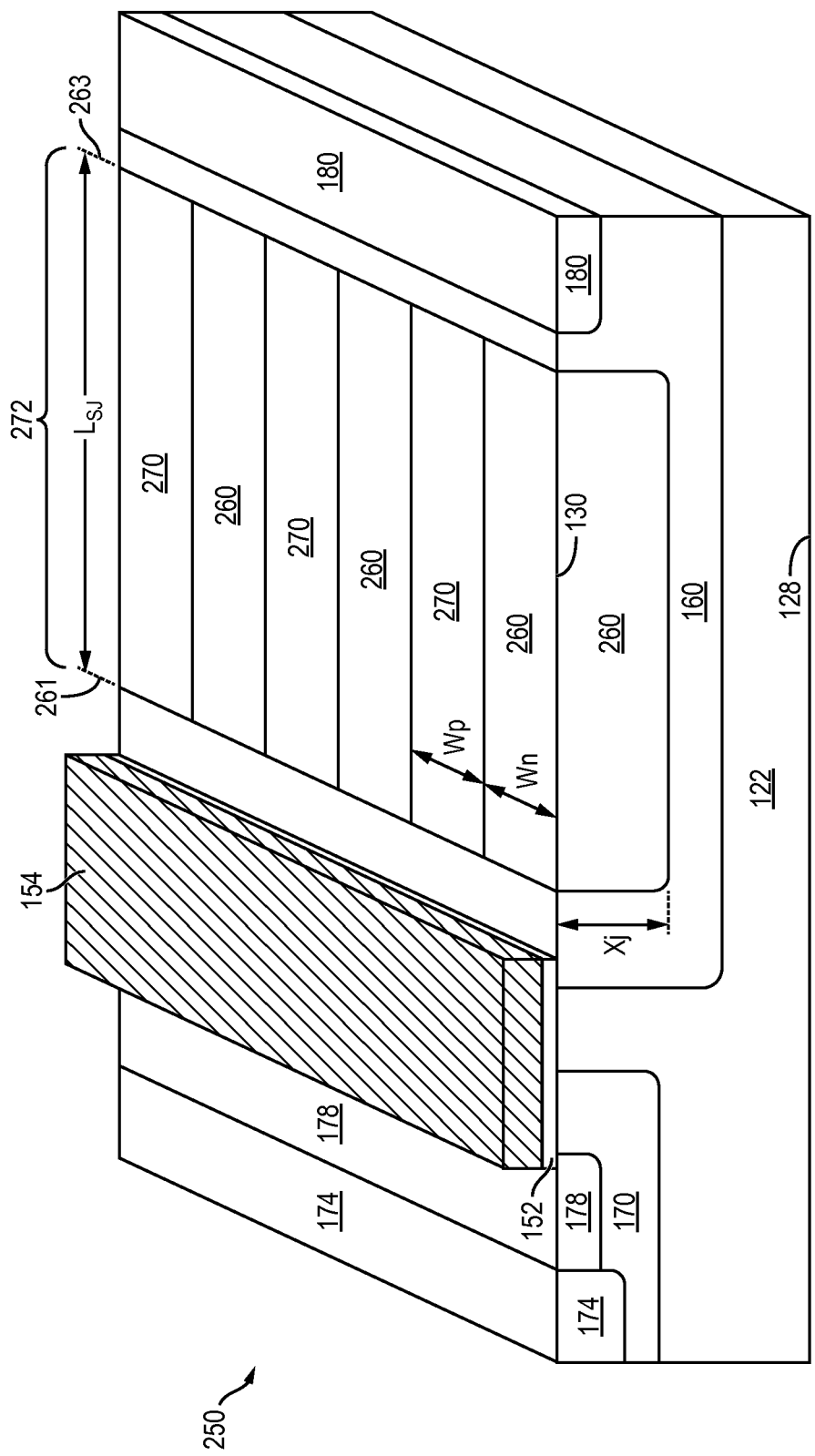

FIG. 6i illustrates MOSFET cell 250 with hard mask 252, etch stop layer 254, and hard mask 264 removed. Dielectric layer 152 is illustrated as being partially removed to better illustrate the doping areas of active surface 130. The hard mask process of forming P-doped stripes 270 allows the P-doped stripes and N-doped stripes 260 to be doped at a higher concentration and with lower widths Wn and Wp, as well as with a deeper junction depth Xj, compared with using the soft mask process illustrated in FIGS. 4a-4p. Using a hard mask process to form N-doped stripes 260 and P-doped stripes 270 allows the ends of the stripes to be self-aligned to lines 261 and 263. Self-aligning the ends of N-doped stripes 260 and P-doped stripes 270 at lines 261 and 263 improves the charge balancing of superjunction 272. A properly charge balanced superjunction 272 increases the benefit of the superjunction on the RDSON and BVdss of MOSFET cell 250. Other than forming N-doped stripes 260 and P-doped stripes 270 with self-aligned ends using a hard mask, MOSFET cell 250 is formed and operates similarly to MOSFET cells 150 and 210.

FIG. 6*j* illustrates a plan view of MOSFET cell 250 without dielectric layer 152, showing the doping regions formed in base substrate material 122. N+ drain contact region 180 is connected to a drain terminal of a MOSFET device which includes MOSFET cell 250. N+ source contact region 178 and P+ source contact region 174 are connected to a source terminal of the MOSFET device. Poly gate 154 is connected to a gate terminal of the MOSFET device. When MOSFET cell 250 is turned on, electric current flows from N+ drain contact region 180 to N+ source contact region 178 via the drift region formed by N-doped stripes 260, P-doped stripes 270, and LDD region 160. Current flows through the drift region, then through a channel of electrons formed under poly gate 154, to N+ source contact region 178. P+ source contact region 174 is used to bias the parasitic BJT of MOSFET cell 250 to prevent latch-up. P+ source contact region 174 also allows current through MOSFET cell 250 when the MOSFET cell is in avalanche. P-doped stripes 270 and N-doped stripes 260 are self-aligned at lines 261 and 263 by using hard mask 252 to define the lengths of each stripe.

FIG. 6*k* illustrates a cross-sectional view of a portion of MOSFET cell 250. N-doped stripes 260 and P-doped stripes 270 are interleaved across MOSFET cell 250. In the illustrated embodiment, the width of N-doped stripes 260, Wn, and the width of P-doped stripes 270, Wp, are equal. In other embodiments, Wn is made a different value than Wp. Each N-doped stripe 260 and P-doped stripe 270 includes an approximately uniform depth, Xj. A portion of LDD region 160 remains under N-doped stripes 260 and P-doped stripes 270. A portion of base substrate material 122 which was not doped during the formation of MOSFET cell 250 remains under LDD region 160.

The self-aligned hard mask process for forming superjunction 272 illustrated in FIGS. 6*a*-6*k* is used to form other types of devices than power MOSFET cells in other embodiments. In one embodiment, a diode is formed using a superjunction self-aligned by the process disclosed in FIGS. 6*a*-6*k*. In other embodiments, a vertical MOSFET is formed using a superjunction self-aligned by the process disclosed in FIGS. 6*a*-6*k*.

Figure 7:
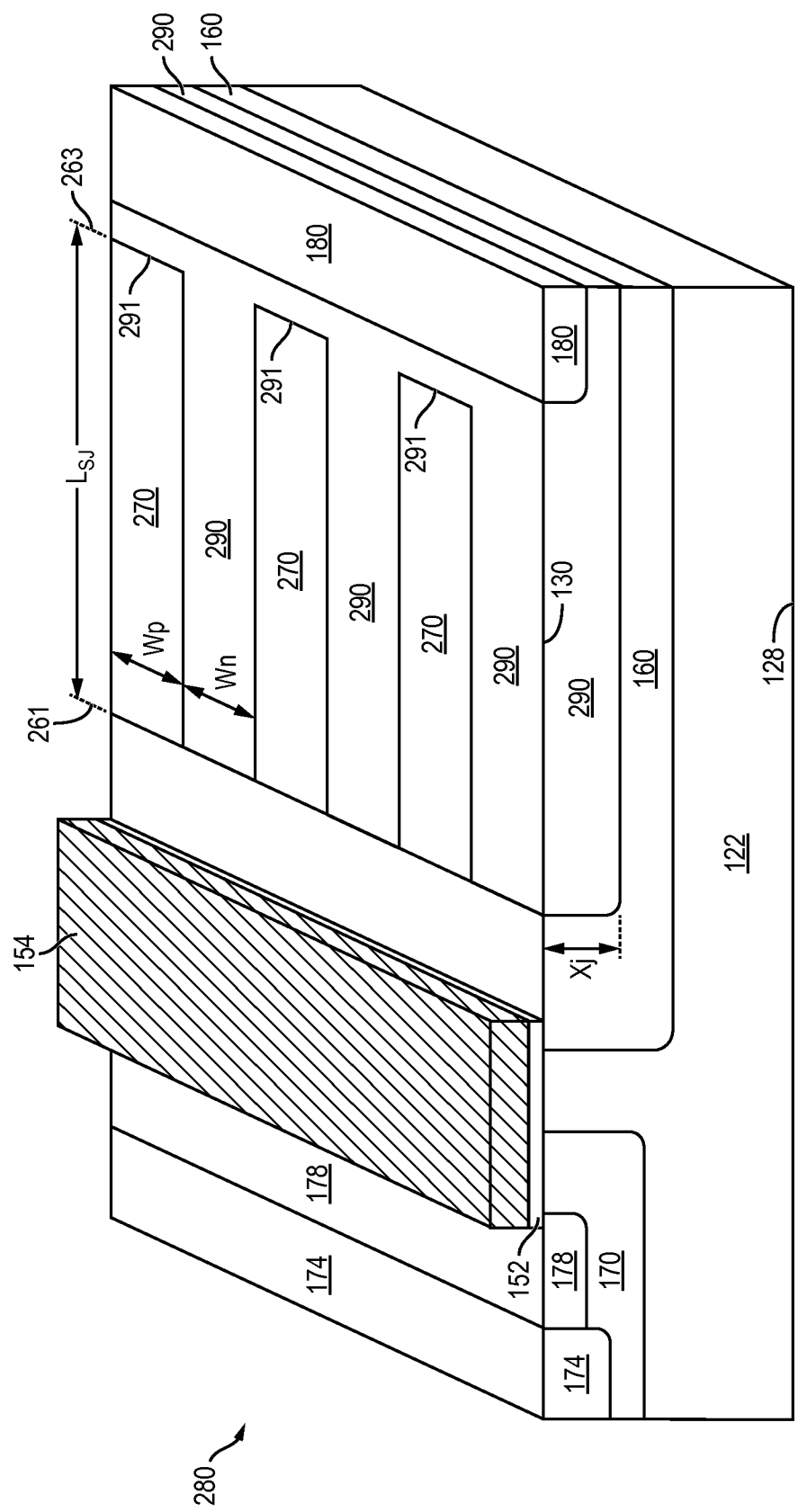
FIG. 7 illustrates a power MOSFET utilizing a superjunction with surrounding LDD region formed with N-doped stripes extending through an N+ doped drain contact region.

FIG. 7 illustrates MOSFET cell 280. Although MOSFET cell 280 is formed using the self-aligned hard mask process of FIGS. 6*a*-6*k*, the MOSFET cell is formed using the soft mask process illustrated in FIGS. 4*a*-4*p* or the hard mask process illustrated in FIGS. 5*a*-5*f* in other embodiments. MOSFET cell 280 includes N-drift region 290 which extends beyond the superjunction length, Lsj, and P-doped stripes 270, to N+ drain contact region 180. N-drift region 290 is formed with a longer mask opening than P-doped stripes 270 so that only the ends of the N-drift region and P-doped stripes toward poly gate 154 are aligned. When formed using the self-aligning process illustrated in FIGS. 6*a*-6*k*, hard mask 252 is etched over N+ contact 180, while hard mask 264 is etched to line 263, so stripes 260 and 270 are self-aligned at line 261 but not line 263. Hard mask 252 defines the endpoint of P-doped stripes 270 at line 261, while hard mask 264 defines the endpoint of P-doped stripes 270 at line 263. P-doped stripes 270 are formed with ends 291 toward N+ drain region 180 which are surrounded by N-doped drift region 290. N+ drain contact region 180 is surrounded by N-doped drift region 290.

Extending N-drift region 290 to N+ drain contact region 180 benefits RDSON of MOSFET cell 280. N-drift region 290 includes a higher doping concentration than LDD region 160, and reduces the resistance for current flowing between N+ drain contact region 180 and the superjunction formed by the N-drift region and P-doped stripes 270. N-drift region 290 also operates as an adaptive RESURF or drain buffer zone around N+ drain contact region 180.

Figure 8:
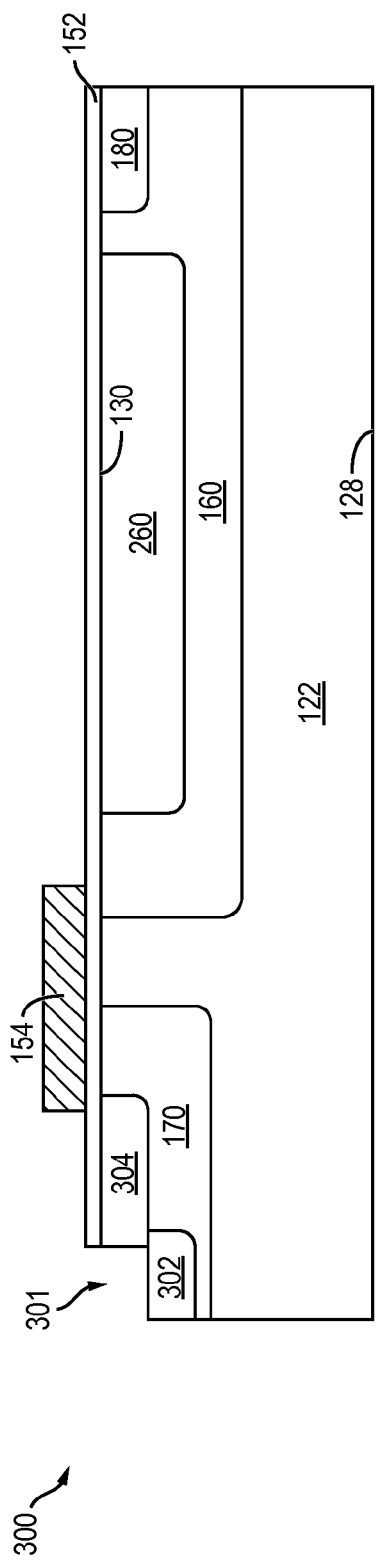
FIG. 8 illustrates a power MOSFET utilizing a superjunction with surrounding LDD region formed with a source trench.

FIG. 8 illustrates MOSFET cell 300. Although MOSFET cell 300 is formed using the self-aligned hard mask process of FIGS. 6*a*-6*k*, the MOSFET cell is formed using the soft mask process illustrated in FIGS. 4*a*-4*p* or the hard mask process illustrated in FIGS. 5*a*-5*f* in other embodiments. MOSFET cell 300 includes source trench 301. During formation of MOSFET cell 300, source trench 301 is etched into P-channel region 170 of base substrate material 122 prior to the formation of P+ source contact region 302. Source trench 301 extends across MOSFET cell 300 in parallel with poly gate 154. P+ source contact region 302 and N+ source contact region 304 are formed using a mask similarly to P+ source contact region 174 and N+ source contact region 178 in FIGS. 4*j*-4*k*. However, due to source trench 301, P+ source contact region 302 is formed further away from active surface 130 than N+ source contact region 304. With P+ source contact region 302 below the level of N+ source contact region 304, the width of the N+ source contact region can be extended over the P+ source contact region.

Using a wider N+ source contact region 304 decreases RDSON of MOSFET cell 300 by including a larger heavily doped area to reduce resistance. In addition, source trench 301 improves the ability of metal source contacts subsequently formed in the source trench to make good electrical contact with P+ source contact region 302 and N+ source contact region 304. In one embodiment, tungsten contacts are formed periodically spaced in source trench 301, each electrically connected to P+ source contact region 302 and N+ source contact region 304. In another embodiment, source trench 301 is filled with tungsten or another metal to form a contact bar across MOSFET cell 300 electrically connected to P+ source contact region 302 and N+ source contact region 304. In addition, the area of P+ source contact region 302 can be increased without taking away from the area of N+ source contact region 304.

Figure 9:
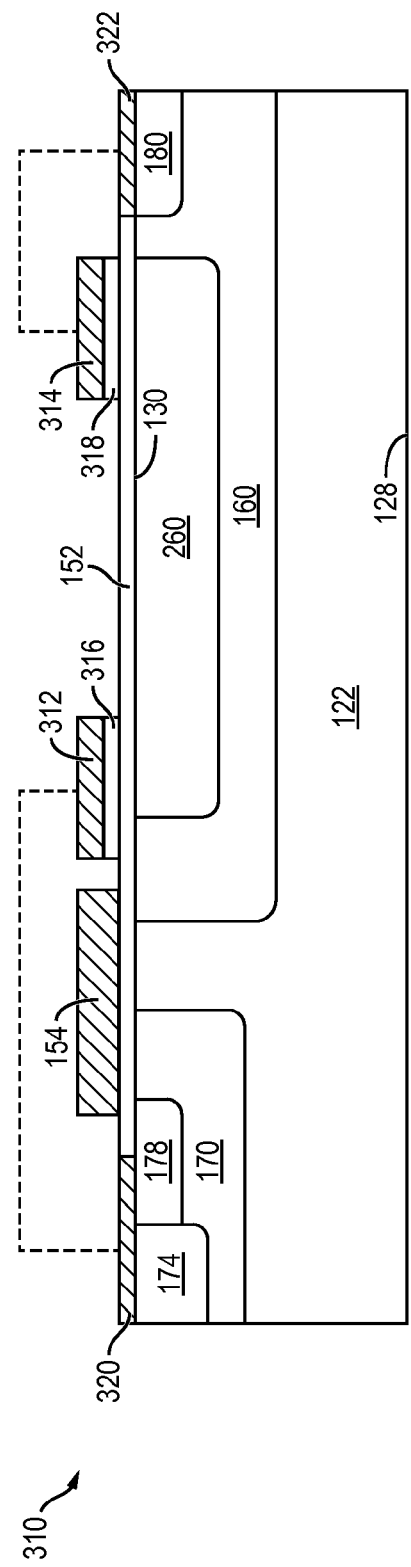
FIG. 9 illustrates a power MOSFET utilizing a superjunction with surrounding LDD region and field plates.

FIG. 9 illustrates MOSFET cell 310. Although MOSFET cell 310 is formed using the self-aligned hard mask process of FIGS. 6*a*-6*k*, the MOSFET cell is formed using the soft mask process illustrated in FIGS. 4*a*-4*p* or the hard mask process illustrated in FIGS. 5*a*-5*f* in other embodiments. After formation of N-doped stripes 260 and P-doped stripes 270, source field plate 312 and drain field plate 314 are formed over LDD region 160 and the stripes. Source field plate 312 is formed over additional dielectric or insulating layer 316, and drain field plate 314 is formed over additional dielectric or insulating layer 318. In other embodiments, dielectric layers 316 and 318 are formed as a continuous dielectric layer under source field plate 312 and drain field plate 314. Dielectric layers 316 and 318 contain one or more layers of SiO2, Si3N4, SiON, Ta2O5, Al2O3, HfO2, BCB, PI, PBO, polymer, or other dielectric material having similar structural and insulating properties. Source field plate 312 is electrically connected to metal source contact 320, which is further electrically connected to N+ source contact region 178, P+ source contact region 174, and a source terminal of a MOSFET device which includes MOSFET cell 310. Drain field plate 314 is electrically connected to metal drain contact 322, which is further electrically connected to N+ drain contact region 180 and a drain terminal of a MOSFET device which includes MOSFET cell 310. Metal source contact 320 and metal drain contact 322 are formed in openings of dielectric layer 152.

MOSFET cell 310 includes points of fixed potential under poly gate 154 and at N+ drain contact region 180. The points of fixed potential cause electric field peaks under poly gate 154 and at N+ drain contact region 180, reducing BVdss. Field plates 312 and 314 modify the electric field in LDD region 160, N-doped stripes 260, and P-doped stripes 270.

Field plates 312 and 314 effectively move the points of fixed potential, and therefore the electric field peaks, away from poly gate 154 and N+ drain contact region 180. By moving the electric field peaks away from poly gate 154 and N+ drain contact region 180, the electric field at the poly gate and N+ drain contact region are reduced. BVdss of MOSFET cell 310 is improved, and a risk of hot carrier injection is reduced.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
   providing a substrate;
   forming a gate over the substrate;
   forming a lightly doped drain (LDD) region in the substrate adjacent to the gate;
   forming a first mask over the substrate including a portion of the first mask over the LDD region adjacent to the gate; and
   forming a superjunction in the LDD region using the first mask.

2. The method of claim 1, wherein forming the superjunction includes:
   forming a first region doped with a first type of dopant using the first mask; and
   forming a stripe doped with a second type of dopant using a portion of the first mask.

3. The method of claim 2, further including:
   forming a drain contact region in the substrate; and
   forming the first region extending to the drain contact region.

4. The method of claim 2, further including forming the first region and stripe using chain implants.

5. The method of claim 1, further including:
   forming a trench in the substrate; and
   forming a source contact region in the trench.

6. The method of claim 1, further including:
   forming a source field plate over the substrate; and
   forming a drain field plate over the substrate.

7. The method of claim 2, further including forming the stripe using the portion of the first mask and a second mask.

8. A method of making a semiconductor device, comprising:
   providing a substrate;
   forming a gate over the substrate;
   forming a lightly doped drain (LDD) region in the substrate adjacent to the gate;
   forming a mask over the substrate; and
   forming a superjunction in the LDD region using the mask.

9. The method of claim 8, further including:
   forming a drain contact region in the substrate; and
   forming the superjunction while a first portion of the LDD region remains between the superjunction and gate and a second portion of the LDD region remains between the superjunction and drain contact region.

10. The method of claim 8, wherein forming the superjunction includes:
    forming a first region doped with a first type of dopant; and
    forming a stripe doped with a second type of dopant and self-aligned to the first region.

11. The method of claim 10, further including:
    forming a drain contact region in the substrate; and
    forming the first region extending to the drain contact region.

12. The method of claim 8, further including forming the superjunction using chain implants.

13. The method of claim 8, further including:
    forming a trench in the substrate; and
    forming a source contact region in the trench.

14. The method of claim 8, further including:
    forming a source field plate over the substrate; and
    forming a drain field plate over the substrate.

15. A method of making a semiconductor device, comprising:
    providing a substrate;
    forming a lightly doped drain (LDD) region in the substrate;
    forming a first mask over the substrate;
    forming a first stripe doped with a first type of dopant in the LDD region using the first mask; and
    forming a second stripe doped with a second type of dopant in the LDD region using the first mask, wherein the first stripe and second stripe form a superjunction.

16. The method of claim 15, further including:
    forming a drain contact region in the substrate; and
    forming a portion of the superjunction extending to the drain contact region.

17. The method of claim 15, further including forming the first stripe and second stripe using chain implants.

18. The method of claim 15, further including:
    forming a trench in the substrate; and
    forming a source contact region in the trench.

19. The method of claim 15, further including:
    forming a source field plate over the substrate; and
    forming a drain field plate over the substrate.

20. The method of claim 15, further including forming the second stripe using the first mask and a second mask.

21. A method of making a semiconductor device, comprising:
    providing a substrate;
    forming a lightly doped drain (LDD) region in the substrate; and
    forming a superjunction in the LDD region while a portion of the LDD region remains extending from a surface of the substrate at a first end of the superjunction to the surface of the substrate at a second end of the superjunction.

22. The method of claim 21, wherein forming the superjunction includes:
    forming a mask over the substrate;
    forming a first region doped with a first type of dopant using the mask; and
    forming a stripe doped with a second type of dopant using a portion of the mask.

23. The method of claim 21, further including:
    forming a drain contact region in the substrate; and
    forming a portion of the superjunction extending to the drain contact region.

24. The method of claim 21, further including forming the superjunction using chain implants.

25. The method of claim 21, further including:
    forming a trench in the substrate; and
    forming a source contact region in the trench.

* * * * *